US005629129A

United States Patent [19]

Yamamoto et al.

[11] Patent Number: 5,629,129

[45] Date of Patent: May 13, 1997

[54] HEAT SENSITIVE INK SHEET AND IMAGE FORMING METHOD

[75] Inventors: Mitsuru Yamamoto; Akihiko Takeda; Akihiro Shimomura; Yasutomo Goto, all of Shizouka, Japan

[73] Assignee: Fuji Photo Film Co., Ltd., Kanagawa, Japan

[21] Appl. No.: 514,083

[22] Filed: Aug. 11, 1995

[30] Foreign Application Priority Data

| | | | |
|---|---|---|---|
| Aug. 11, 1994 | [JP] | Japan | 6-189328 |
| Oct. 17, 1994 | [JP] | Japan | 6-250457 |
| Apr. 25, 1995 | [JP] | Japan | 7-124450 |

[51] Int. Cl.$^6$ ................ G03F 7/34; G03C 1/73; G03C 5/56

[52] U.S. Cl. ................ 430/201; 430/200; 430/270.1; 430/964; 503/227

[58] Field of Search ................ 430/200, 201, 430/964, 270.1; 503/227

[56] References Cited

U.S. PATENT DOCUMENTS

| | | | |
|---|---|---|---|
| 4,525,722 | 6/1985 | Sachdev et al. | 430/200 |
| 4,783,375 | 11/1988 | Hashimoto et al. | 428/480 |
| 5,071,502 | 12/1991 | Hashimoto et al. | 428/480 |
| 5,156,938 | 10/1992 | Foley et al. | 430/200 |
| 5,232,817 | 8/1993 | Kawakami et al. | 430/201 |
| 5,278,023 | 1/1994 | Bills et al. | 430/201 |

FOREIGN PATENT DOCUMENTS

| | | | |
|---|---|---|---|
| 610894 | 8/1994 | European Pat. Off. | 430/201 |

*Primary Examiner*—Richard L. Schilling
*Attorney, Agent, or Firm*—Birch, Stewart, Kolasch & Birch, LLP

[57] ABSTRACT

Disclosed is a heat sensitive ink sheet having a support sheet and a heat sensitive ink layer having a thickness of 0.2 to 1.0 µm which is formed of a heat sensitive ink material comprising 30 to 70 weight % of colored pigment, 25 to 65 weight % of amorphous organic polymer having a softening point of 40° to 150° C. and 0.1 to 20 weight % of nitrogen-containing compound. Further, thermal transfer recording methods by area gradation using the heat sensitive ink sheet and an image receiving sheet are also disclosed.

11 Claims, 3 Drawing Sheets

HEAT SENSITIVE INK SHEET AND IMAGE FORMING METHOD

FIELD OF THE INVENTION

This invention relates to an image forming method and a heat sensitive ink sheet favorably employable for the method. In more detail, the invention relates to an image forming method for forming a multicolor image on an image receiving sheet by area gradation using a thermal head or laser beam.

BACKGROUND OF THE INVENTION

Heretofore, there have been known two methods for thermal transfer recording for the preparation of a multicolor image which utilize a thermal head printer, that is, a sublimation dye transfer recording method and a fused ink transfer recording method.

The sublimation dye transfer recording method comprises the steps of superposing on an image receiving sheet an image transfer sheet which is composed of a support and an image transfer layer comprising a sublimation ink and a binder and imagewise heating the support of the transfer sheet to sublimate the sublimation ink to form an image on the image receiving sheet. A multicolor image can be prepared using a number of color transfer sheets such as a yellow transfer sheet, a magenta transfer sheet, and a cyan transfer sheet.

The sublimation dye transfer recording method, however, has the following drawbacks:

1) The gradation of image is mainly formed of variation of the sublimated dye concentration, which is varied by controlling the amount of sublimation of the dye. Such gradation is appropriate for the preparation of a photographic image, but is inappropriate for the preparation of a color proof which is utilized in the field of printing and whose gradation is formed of dots, lines, or the like, that is, area gradation.

2) The image formed of sublimated dye has poor edge sharpness, and a fine line shows thinner density on its solid portion than a thick line. Such tendency causes serious problem in the quality of character image.

3) The image of sublimated dye is poor in endurance. Such image cannot be used in the fields which require multicolor images resistant to heat and light.

4) The sublimation dye transfer recording shows sensitivity lower than the fused ink transfer recording. Such low sensitive recording method is not preferably employable in a high speed recording method utilizing a high resolution thermal head, of which development is expected in the future.

5) The recording material for the sublimation dye transfer recording is expensive, as compared with the recording material for the fused ink transfer recording.

The fused ink transfer recording method comprises the steps of superposing on an image receiving sheet an image transfer sheet having support and a thermal fusible transfer layer which comprises a coloring material (e.g., pigment or dye) and imagewise heating the support of the transfer sheet to portionwise fuse the transfer layer to form and transfer an image onto the image receiving sheet. A multicolor image also can be prepared using a number of color transfer sheets.

The fused ink transfer recording method is advantageous in the sensitivity, cost, and endurance of the formed image, as compared with the sublimation dye transfer recording method. It, however, has the following drawbacks:

The color image prepared by the fused ink transfer recording method is poor in its quality, as compared with the sublimation dye transfer recording method. This is because the fused ink transfer recording utilizes not gradation recording but binary (i.e., two valued) recording. Therefore, there have been reported a number of improvements on the fusible ink layer of the fused ink transfer recording method for modifying the binary recording to give gradation recording so that a color image having multi-gradation is prepared by the fused ink transfer recording method. The basic concept of the heretofore reported improvement resides in portionwise (or locally) controlling the amount of the ink to be transferred onto the image receiving sheet. In more detail, the mechanism of transfer of the ink in the fused ink transfer recording method is as follows; under heating by the thermal head, the viscosity of the ink layer at the site in contact with the thermal head lowers and the ink layer tends to adhere to the image receiving sheet, whereby the transfer of the ink takes place. Therefore, the amount of the transferred ink can be controlled by varying degree of elevation of temperature on the thermal head so that the cohesive failure in the ink layer is controlled and the gamma characteristic of the transferred image is varied. Thus, the optical density of the transferred ink image is portionwise varied, and accordingly, an ink image having gradation is formed. However, the optical density of a fine line produced by the modified fused ink transfer recording is inferior to that produced by the sublimation dye transfer recording method. Moreover, the optical density of a fine line produced by the modified fused ink transfer recording method is not satisfactory.

Further, the fused ink transfer recording method has other disadvantageous features such as low resolution and poor fixation of the transferred ink image. This is because the ink layer generally uses crystalline wax having a low melting point as the binder, and the wax tends to spread on the receiving sheet in the course of transferring under heating. Furthermore, the crystalline wax scarcely gives a transparent image due to light scattering on the crystalline phase. The difficulty in giving a transparent image causes serious problems in the preparation of a multicolor image which is formed by superposing a yellow image, a magenta image, and a cyan image. The requirement to the transparency of the formed image restricts the amount of a pigment to be incorporated into the ink layer. For instance, Japanese Patent Publication No. 63(1988)-65029 describes that the pigment (i.e., coloring material) should be incorporated in the ink layer in an amount of not more than 20 weight % based on the total amount of the ink layer. If an excessive amount of the pigment is employed, the transparency of the transferred ink image is made dissatisfactory.

Improvements of reproduction of a multicolor image in the fused ink transfer recording have been studied and proposed, so far. For instance, Japanese Patent Provisional Publication No. 61(1986)-244592 (=Japanese Patent Publication No. 5(1993)-13072) describes a heat sensitive recording material which has a heat sensitive layer comprising at least 65 weight % of an amorphous polymer, a releasing agent, and a coloring material (dye or pigment) which can reproduce a color image having continuous gradation with improved transparency and fixation strength. The publication indicates that the amorphous polymer in an amount of 65 weight % gives a heat sensitive ink layer of extremely poor transparency and therefore cannot reproduce a satisfactory color image, and at least 70 weight % of the amorphous polymer is required to give a sufficiently transparent ink layer. Further, the amount of the coloring material is required to be not more than 30 weight % to obtain the sufficiently transparent ink layer. As for the thickness of the heat-sensitive ink layer, it is described that 0.5 μm to 50 μm, specifically 1 μm to 20 μm, is preferred to obtain practical density or strength of an image. In the working examples, the thickness of the ink layer is approximately 3 μm which is similar to that of the conventional ink layer using wax binder. Furthermore, the publication indicates that the heat sensitive recording material can also utilize binary recording and multi-valued recording (i.e., image recording method utilizing multi-dots having area different from one another; VDS (Variable Dot System)).

The study of the inventors has clarified that recording by the continuous gradation using the heat sensitive recording material of the publication does not give an image having satisfactory continuity and stability of density. Further, the binary or multi-valued recording using the heat sensitive recording material does not give an image having satisfactory continuity of density, transparency (especially transparency of multicolor image) and sharpness in edge portion.

In contrast, it is known that a thermal transfer recording method can prepare a multicolor image having multi-gradation by means of the multi-valued recording which utilizes area gradation. Further, it is also known that a heat sensitive ink sheet which can be used in the multi-valued recording utilizing area gradation, preferably have the following characteristics:

(1) Each color image (i.e., cyan image, magenta image or yellow image) of the multicolor image for color proofing should have a reflection density of at least 1.0, preferably not less than 1.2, and especially not less than 1.4, and a black image preferably has a reflection density of not less than 1.5. Thus, it is desired that the heat sensitive ink sheet has the above reflection densities.

(2) An image which is produced by area gradation is satisfactory.

(3) An image can be produced in the form of dots, and the formed line or point has high sharpness in the edge.

(4) An ink layer (image) transferred has high transparency.

(5) An ink layer has high sensitivity.

(6) An image transferred onto a white paper (e.g., coated paper) should be analogous to a printed image in tone and surface gloss.

As for the thermal head printer, the technology has been very rapidly developed. Recently, the thermal head is improved to give a color image with an increased resolution and multi-gradation which is produced by area gradation. The area gradation means gradation produced not by variation of optical density in the ink area but by size of ink spots or lines per unit area. Such technology is described in Japanese Patent Provisional Publications No. 4(1992)-19163 and No. 5(1993)-155057 (for divided sub-scanning system) and the preprint of Annual Meeting of Society of Electrography (1992/7/6) (for heat concentrated system).

As a transfer image forming method using the heat sensitive ink sheet, recently a method using a laser beam (i.e., digital image forming method) has been developed. The method comprises the steps of: superposing the heat sensitive ink layer of the heat sensitive ink sheet on an image receiving sheet, and applying a laser beam modulated by digital signal on the heat sensitive ink layer through the support of the heat sensitive ink sheet to form and transfer an image of the heat sensitive ink layer onto the image receiving sheet (the image can be further retransferred onto other sheet). In the method, the heat sensitive ink sheet generally has a light-heat conversion layer provided between the ink layer and the support to efficiently convert light energy of laser beam into heat energy. The light-heat conversion layer is a thin layer made of carbon black or metal. Further, a method for locally peeling the ink layer to transfer the peeled ink layer onto the image receiving sheet (i.e., ablation method), which does not fuse the layer in the transferring procedure, is utilized in order to enhance image quality such as evenness of reflection density of the image or sharpness in edges of the image.

SUMMARY OF THE INVENTION

An object of the present invention is to provide a heat sensitive ink sheet satisfying the characteristics described above (1) to (6), which is suitable for image forming method by multi-gradation.

Another object of the invention is to provide a heat sensitive ink sheet giving an image which has dots having preferable size and shape (i.e., near to predetermied size and shape) and good reproduction of gradation and which is well analogous to a printed image.

A further object of the invention is to provide a heat sensitive ink sheet which can give a satisfactory image independent of material of a support to be transferred and environment for conducting the transferring process.

A still further object of the invention is to provide an image forming method which uses the heat sensitive ink sheet.

The present inventors have studied to obtain the heat sensitive ink sheet having excellent characteristics described above. As a result, the inventors have found that a thin layer heat-sticking-peeling method (i.e., method using a thin ink layer containing pigment in high content) is advantageous, and that it is preferred to incorporate a nitrogen-containing compound into the thin ink layer to be used for the method. In more detail, the heat sensitive ink sheet having the thin ink layer can give a satisfactory image independent of material of a support to be transferred and environment for conducting the transferring process.

There is provided by the present invention a heat sensitive ink sheet having a support sheet and a heat sensitive ink layer having a thickness of 0.2 to 1.0 μm which is formed of a heat sensitive ink material comprising 30 to 70 weight % of colored pigment, 25 to 65 weight % of amorphous organic polymer having a softening point of 40° to 150° C. and 0.1 to 20 weight % of a nitrogen-containing compound.

The preferred embodiments of the above-mentioned heat sensitive ink sheet are as follows:

1) The heat sensitive ink sheet wherein at least 70 weight % of the colored pigment has a particle size of 0.1to 1.0 μm.

2) The heat sensitive ink sheet wherein the nitrogen-containing compound is an amide compound having the formula (i):

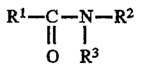

(I)

in which $R^1$ represents an alkyl group of 8 to 24 carbon atoms, an alkoxyalkyl group of 8 to 24 carbon atoms, an alkyl group of 8 to 24 carbon atoms having a hydroxyl group, or an alkoxyalkyl group of 8 to 24 carbon atoms having a hydroxyl group, and each of $R^2$ and $R^3$ independently represents a hydrogen atom, an alkyl group of 1 to 12 carbon atoms, an alkoxyalkyl of 1 to 12 carbon atoms, an alkyl group of 1 to 12 carbon atoms having a hydroxyl group, or an alkoxyalkyl group of 1 to 12 carbon atoms having a hydroxyl group, provided that $R^1$ is not the alkyl group in the case that $R^2$ and $R^3$ both represent a hydrogen atom.

3) The heat sensitive ink sheet wherein the nitrogen-containing compound is a quaternary ammonium salt having the formula (II):

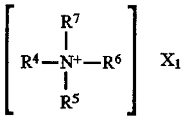

(II)

in which $R^4$ represents an alkyl group of 1 to 18 carbon atom or an aryl group of 6 to 18 carbon atoms, each of $R^5$, $R^6$ and $R^7$ independently represents a hydrogen atom, a hydroxyl group, an alkyl group of 1 to 18 carbon atom or an aryl group of 6 to 18 carbon atoms, and $X_1$ represents a monovalent anion.

4) The heat sensitive ink sheet wherein the nitrogen-containing compound is a quaternary ammonium salt having the formula (III):

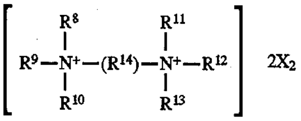

(III)

in which each of $R^8$, $R^9$, $R^{10}$, $R^{11}$, $R^{12}$ and $R^{13}$ independently represents a hydrogen atom, a hydroxyl group, an alkyl group of 1 to 18 carbon atom or an aryl group of 6 to 18 carbon atoms, $R^{14}$ represents an alkylene group of 1 to 12 carbon atom, and $X_2$ represents a monovalent anion.

5) The heat sensitive ink sheet wherein the amorphous organic polymer is butyral resin or styrene/maleic acid half-ester resin.

6) The heat sensitive ink sheet wherein the thickness of the heat sensitive ink layer is in the range of 0.2 to 0.6 μm.

7) The heat sensitive ink sheet wherein the heat sensitive ink layer has tensile strength at break of not more than 10 MPa.

There is also provided by the present invention an image forming method which comprises the steps of:

superposing the heat sensitive ink sheet of claim 1 on an image receiving sheet;

placing imagewise a thermal head on the support of the heat sensitive ink sheet to form an image of the ink material with area gradation on the image receiving sheet;

separating the support of the heat sensitive ink sheet from the image receiving sheet so that the image of the ink material can be retained on the image receiving sheet;

superposing the image receiving sheet on a white paper sheet in such a manner that the image of the ink material is in contact with a surface of the white paper sheet; and separating the image receiving sheet from the white paper sheet, keeping the image of the ink material on the white paper sheet, said image of the ink material on the white paper sheet having an optical reflection density of at least 1.0.

In the method, a white paper sheet can be employed instead of the image receiving sheet, and in this case the two following steps are omitted.

There is further provided by the invention a thermal transfer recording method which comprises the steps of:

superposing the heat sensitive ink sheet of claim 1 on an image receiving sheet;

irradiating a laser beam modulated by digital signals on the heat sensitive ink layer through the support of the heat sensitive ink sheet to form an image of the ink material on the image receiving sheet;

separating the support of the heat sensitive ink sheet from the image receiving sheet so that the image of the ink material can be retained on the image receiving sheet;

superposing the image receiving sheet on a white paper sheet in such a manner that the image of the ink material is in contact with a surface of the white paper sheet; and separating the image receiving sheet from the white paper sheet, keeping the image of the ink material on the white paper sheet, said image of the ink material on the white paper sheet having an optical reflection density of at least 1.0.

In the method, a white paper sheet can be employed instead of the image receiving sheet, and in this case the following two steps are omitted.

After irradiation of a laser beam, the formation of the image of the ink material on the image receiving sheet can be done through ablation of the image from the support of the heat sensitive ink sheet.

The method of the invention can be utilized advantageously in preparation of a color proof of full color type.

In more detail, the preparation of a color proof can be performed by the steps of:

superposing a first heat sensitive ink sheet (such as a cyan ink sheet) on an image receiving sheet;

placing imagewise a thermal head on the support of the first heat sensitive ink sheet to form and transfer a color image (cyan image) of the heat sensitive ink material onto the image receiving sheet;

separating the support of the ink sheet from the image receiving sheet so that the color image (cyan image) of the heat sensitive ink material is retained on the image receiving sheet;

superposing a second heat sensitive ink sheet (such as a magenta ink sheet) on the image receiving sheet having the cyan image thereon;

placing imagewise a thermal head on the support of the second heat sensitive ink sheet to form and transfer a color image (magenta image) of the heat sensitive ink material onto the image receiving sheet;

separating the support of the ink sheet from the image receiving sheet so that the color image (magenta image) of the heat sensitive ink material is retained on the image receiving sheet;

superposing a third heat sensitive ink sheet (such as a yellow ink sheet) on the image receiving sheet having the cyan image and magenta image thereon;

placing imagewise a thermal head on the support of the second heat sensitive ink sheet to form and transfer a color image (yellow image) of the heat sensitive ink material onto the image receiving sheet;

separating the support of the ink sheet from the image receiving sheet so that the color image (yellow image) of the heat sensitive ink material is retained on the image receiving sheet, whereby a multicolor image is formed on the image receiving sheet; and transferring thus prepared multicolor image onto a white paper sheet.

In the process, the heat sensitive ink sheet of the invention can be employed as the first, second and third heat sensitive ink sheets.

Use of the heat sensitive ink sheet containing the nitrogen-containing compound enables to give an image which has dots having appropriate size and shape and good reproduction of gradation and which is extremely analogous to a printed image. When a transferred image formed of the heat sensitive ink sheet is further retransferred onto a white paper sheet for printing, the resultant image can give a satisfactory image independent of material of a support to be transferred and environment for conducting the transferring process. Hence, the heat sensitive ink sheet of the invention can be advantageously utilized for preparing a color proof.

Figure 1:
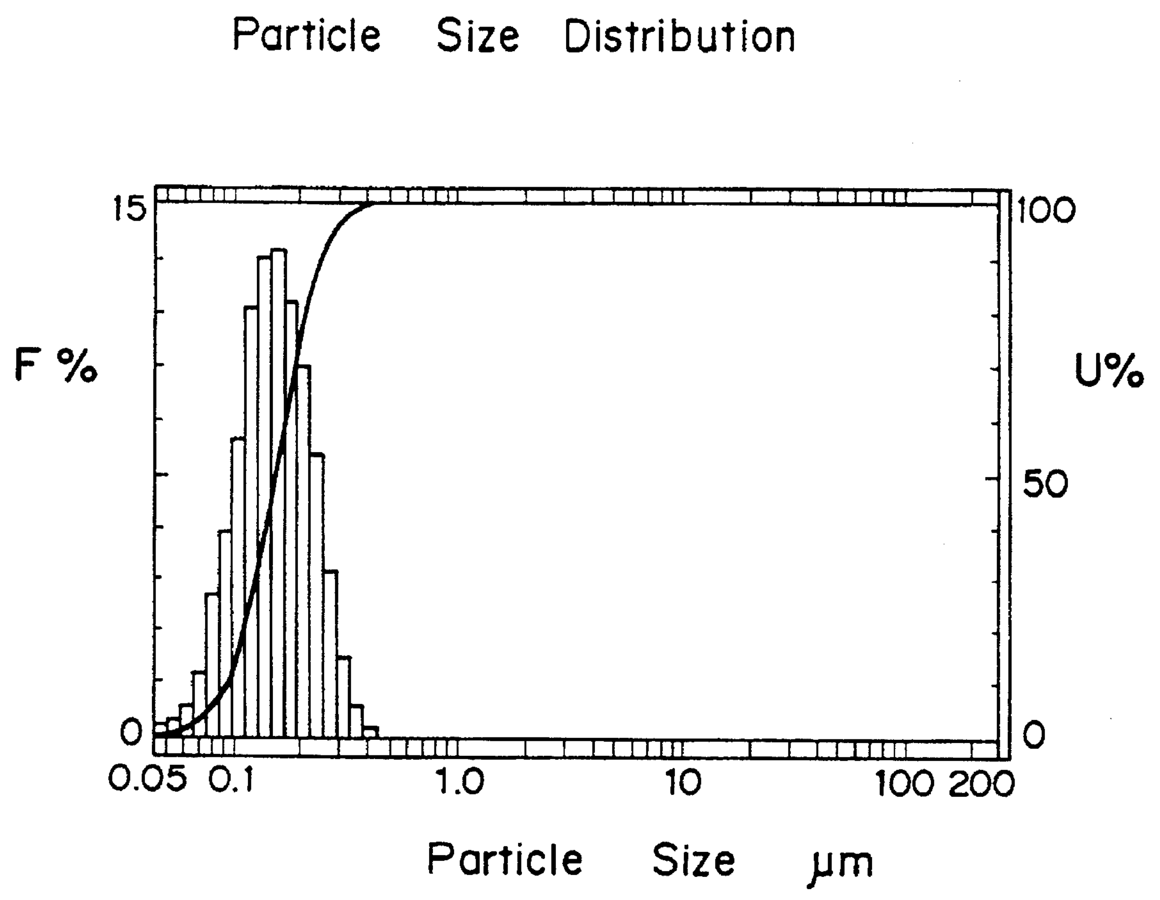
FIG. 1 shows a particle size distribution of cyan pigment employed in Example 1.

In each figure, the axis of abscissas indicates particle size (μm), the left axis of ordinates indicates percentage (%) of particles of the indicated particle sizes, and the right axis of ordinates indicates accumulated percentage (%).

DETAILED DESCRIPTION OF THE INVENTION

The heat sensitive ink sheet is advantageously employed in the image forming method of the invention for thermal transfer recording by area gradation is described below.

The heat sensitive ink sheet has a support sheet and a heat sensitive ink layer having a thickness of 0.2 to 1.0 μm which is formed of a heat sensitive ink material comprising 30 to 70 weight % of colored pigment, 25 to 65 weight % of amorphous organic polymer having a softening point of 40° to 150° C. and 0.1 to 20 weight % of a nitrogen-containing compound. The heat sensitive ink sheet can be particularly utilized in the formation of multigradation image (especially multicolor image) by area gradation (multi-valued recording), while the sheet can be naturally utilized in binary recording.

The reason why the incorporation of the nitrogen-containing compound into the heat sensitive ink sheet brings about formation of good transferred image is presumed as follows: A sizing agent such as clay is contained in a paper for print (e.g., coated paper), and the compound has affinity for the sizing agent, whereby the transferring property can be improved and influence of environment on the transferring procedure can be reduced.

As the support sheet, any of the materials of the support sheets employed in the conventional fused ink transfer system and sublimation ink transfer system can be employed. Preferably employed is a polyester film of approx. 5 μm thick which has been subjected to release treatment.

The colored pigment to be incorporated into the heat sensitive ink layer of the invention can be optionally selected from known pigments. Examples of the known pigments include carbon black, azo-type pigment, phthalocyanine-type pigment, qunacridone-type pigment, thioindigo-type pigment, anthraquinone-type pigment, and isoindolin-type pigment. These pigments can be employed in combination with each other. A known dye can be employed in combination with the pigment for controlling hue of the color image.

The heat transfer ink layer of the invention contains the pigment in an amount of 30 to 70 weight % and preferably in an amount of 30 to 50 weight %. When the amount of the pigment is not less than 30 weight %, it is difficult to form an ink layer of the thickness of 0.2 to 1.0 μm which shows a high reflection density. Moreover, the pigment preferably has such particle distribution that at least 70 weight % of the pigment particles has a particle size of not less than 1.0 μm. A pigment particle of large particle size reduces transparency of the formed image, particularly in the area in which a number of color images are overlapped. Further, large particles bring about difficulty to prepare the desired ink layer satisfying the relationship between the preferred thickness and reflection density.

Any of amorphous organic polymers having a softening point of 40° to 150° C. can be employed for the preparation of the ink layer of the heat sensitive ink sheet of the invention. A heat-sensitive ink layer using an amorphous organic polymer having a softening point of lower than 40° C. shows unfavorable adhesion, and a heat-sensitive ink layer using an amorphous organic polymer having a softening point of higher than 150° C. shows poor sensitivity. Examples of the amorphous organic polymers include butyral resin, polyamide resins polyethyleneimine resin, sulfonamide resin, polyester-polyol resin, petroleum resin, homopolymers and copolymers of styrene or its derivatives (e.g., styrene, vinyltoluene, α-methylstyrene, 2-methylstyrene, chlorostyrene, vinylbenzoic acid, sodium vinylbenzenesulfonate and aminostyrene), and homopolymers and copolymers of methacrylic acid or its ester (e.g., methacrylic acid, methyl methacrylate, ethyl methacrylate, butyl methacrylate, and hydroxyethyl methacrylate), homopolymers and copolymers of acrylic acid or its ester (e.g., acrylic acid, methyl acrylate, ethyl acrylate, butyl acrylate, and α-ethylhydroxy acrylate), homopolymers and copolymers of a diene compound (e.g., butadiene and isoprene), and homopolymers and copolymers of other vinyl monomers (e.g., acrylonitrile, vinyl ether, maleic acid, maleic acid ester, maleic anhydride, cinnamic acid, vinyl chloride, and vinyl acetate). Further, there can be mentioned copolymers of at least two monomers selected from methacrylic acid, its ester, methacrylic acid, its ester, a diene compound and other vinyl monomers, which are described above. These resins and polymers can be employed in combination.

Particularly preferred are butyral resin and styrene-maleic acid half ester resin, from the viewpoint of good dispersibility of the pigment.

Examples of trade names of the butyral resin include Denka butyral #2000-L (softening point: 57° C. (measured by DSC (Differential Scanning Calorimeter)); degree of polymerization: approx. 300) and Denka butyral #4000-1 (softening point: 57° C.; degree of polymerization: approx. 920) which are available from Denki Kagaku Kogyo Co., Ltd.; and Eslec BX-10 (softening point: 72° C.; Tg: 74° C., degree of polymerization: 80, acetyl value: 69 molar %) and Eslec BL-S (Tg: 61° C., viscosity: 12 cps) which are available from Sekisui Chemical Co., Ltd.

In the heat sensitive ink sheet of the invention, the ink layer contains the amorphous organic polymer having a softening point of 40° to 150° C. in an amount of 25 to 65 weight %, and preferably in an amount of 30 to 50 weight %.

The nitrogen-containing compound of the invention contained in the heat sensitive ink layer preferably is an amide compound having the formula (I) described above, an amine compound, a quaternary ammonium salt having the formula (II) or formula (III) described above, hydarazine, aromatic amine or a heterocyclic compound. Preferred is an amide compound having the formula (I) or the quaternary ammonium salt having the formula (II) or formula (III).

The amide compound having the formula (I) is explained. In the formula (I), $R^1$ generally is an alkyl group of 8 to 18 carbon atoms, an alkoxyalkyl group of 8 to 18 carbon atoms, an alkyl group of 8 to 18 carbon atoms having a hydroxyl group, or an alkoxyalkyl group of 8 to 18 carbon atoms having a hydroxyl group. $R^1$ preferably is an alkyl group of 8 to 18 carbon atoms (especially 12 to 18 carbon atoms) or an alkyl group of 8 to 18 carbon atoms (especially 12 to 18 carbon atoms) having a hydroxyl group. Examples of the alkyl groups include methyl, ethyl, isopropyl, n-propyl, n-butyl, isobutyl, tert-butyl, n-pentyl, n-hexyl, n-octyl, nonyl, decyl, undecyl, dodecyl, tridecyl, tetradecyl, pentadecyl, hexadecyl, heptadecyl and octadecyl.

$R^2$ generally represents a hydrogen atom, an alkyl group of 1 to 10 carbon atoms (especially 1 to 8 carbon atoms), an alkoxyalkyl group of 1 to 10 carbon atoms (especially 1 to 8 carbon atoms), an alkyl group of 1 to 10 carbon atoms having a hydroxyl group (especially 1 to 8 carbon atoms), or an alkoxyalkyl group of 1 to 10 carbon atoms having a hydroxyl group (especially 1 to 8 carbon atoms). $R^2$ preferably is an alkyl group of 1 to 10 carbon atom (especially 1 to 8 carbon atoms) or an alkyl group of 1 to 10 carbon atom (especially 1 to 8 carbon atoms) having a hydroxyl group. Examples of the alkyl groups include methyl, ethyl, isopropyl, n-propyl, n-butyl, isobutyl, tert-butyl, n-pentyl, n-hexyl, n-octyl, nonyl, decyl, undecyl, dodecyl, tridecyl, tetradecyl, pentadecyl, hexadecyl, heptadecyl and octadecyl.

$R^3$ preferably is a hydrogen atom, an alkyl group of 1 to 4 carbon atom (especially 1 to 3 carbon atoms). Especially, $R^3$ preferably is a hydrogen atom. Examples of the alkyl groups include methyl, ethyl, isopropyl, n-propyl, n-butyl, isobutyl and tert-butyl.

However, $R^1$ is not the alkyl group (i.e., $R^1$ is the alkoxyalkyl, the alkyl group having a hydroxyl group or the alkoxyalkyl having a hydroxyl group), in the case that $R^2$ and $R^3$ both represent a hydrogen atom.

The amide of the formula (I) can be prepared by reacting an acyl halide with amine (by adding acyl halide to an aqueous alkaline solution containing the amine) to introduce the acyl group into the amine, which is performed, for example, according to Schotten-Baumann method. In more detail, acyl halide is dropwise added to a chilled alkaline solution containing amine, and operations such as addition and mixing are conducted so as to maintain the reaction temperature of not higher than 15° C. In the reaction, use of amine, alkali and acyl halide in a ratio of 1:1:1 gives an amide compound.

In the case that amine which is sparingly soluble in water is used, an ether solution containing tertiary amine is employed instead of the aqueous alkaline solution. In more detail, an acyl halide is dropwise added to an ether solution containing amine and triethylamine. In the reaction, use of amine, triethylamine and an acyl halide in the ratio of 1:1:1 gives an amide compound. The obtained amide compound can be purified by recrystallization if desired, to give a pure amide compound.

The amide compound of the formula (I) can be, for example, prepared by using an acyl halide and amine in the combinations set forth in Table 1.

TABLE 1

| Acyl Halide | Amine |
|---|---|
| $CH_3(CH_2)_5CH(OH)(CH_2)_{10}COCl$ | $H_2NC_2H_4OH$ |
| $CH_3(CH_2)_5CH(OH)(CH_2)_{10}COCl$ | $NH_3$ |
| $n\text{-}C_9H_{19}COCl$ | $CH_3NH_2$ |
| $n\text{-}C_{15}H_{31}COCl$ | $CH_3NH_2$ |
| $n\text{-}C_{17}H_{35}COCl$ | $CH_3NH_2$ |
| $n\text{-}C_{17}H_{35}COCl$ | $C_2H_5NH_2$ |

TABLE 1-continued

| Acyl Halide | Amine |
|---|---|
| $n\text{-}C_{17}H_{35}COCl$ | $n\text{-}C_4H_9NH_2$ |
| $n\text{-}C_{17}H_{35}COCl$ | $n\text{-}C_6H_{13}NH_2$ |
| $n\text{-}C_{17}H_{35}COCl$ | $n\text{-}C_8H_{17}NH_2$ |
| $n\text{-}C_{17}H_{35}COCl$ | $H_2NC_2H_4OC_2H_4OH$ |
| $n\text{-}C_{17}H_{35}COCl$ | $(CH_3)_2NH$ |
| $n\text{-}C_{17}H_{35}COCl$ | $(C_2H_5)_2NH$ |

Examples of the obtained amide compounds are shown in Table 2. The compounds are indicated by $R^1$, $R^2$ and $R^3$ of the formula (I).

TABLE 2

| $R^1$ | $R^2$ | $R^3$ |
|---|---|---|
| $CH_3(CH_2)_5CH(OH)(CH_2)_{10}$ | $C_2H_4OH$ | H |
| $CH_3(CH_2)_5CH(OH)(CH_2)_{10}$ | H | H |
| $n\text{-}C_9H_{19}$ | $CH_3$ | H |
| $n\text{-}C_{15}H_{31}$ | $CH_3$ | H |
| $n\text{-}C_{17}H_{35}$ | $CH_3$ | H |
| $n\text{-}C_{17}H_{35}$ | $C_2H_5$ | H |
| $n\text{-}C_{17}H_{35}$ | $n\text{-}C_4H_9$ | H |
| $n\text{-}C_{17}H_{35}$ | $n\text{-}C_6H_{13}$ | H |
| $n\text{-}C_{17}H_{35}$ | $n\text{-}C_8H_{17}$ | H |
| $n\text{-}C_{17}H_{35}$ | $C_2H_4OC_2H_4OH$ | H |
| $n\text{-}C_{17}H_{35}$ | $CH_3$ | $CH_3$ |
| $n\text{-}C_{17}H_{35}$ | $C_2H_5$ | $C_2H_5$ |

Subsequently, the quaternary ammonium salt of the formula (II) described above is explained below.

In the formula (II), $R^4$ preferably is an alkyl group of 1 to 12 carbon atom (especially 1 to 8 carbon atom) or an aryl group of 6 to 12 carbon atoms (e.g., phenyl or naphthyl). Examples of the alkyl groups include methyl, ethyl, isopropyl, n-propyl, n-butyl, isobutyl, tert-butyl, n-pentyl, n-hexyl and n-octyl. Each of $R^5$, $R^6$ and $R^7$ preferably is an alkyl group of 1 to 12 carbon atom (especially, 1 to 8 carbon atom) or an aryl group of 6 to 12 carbon atoms (e.g., phenyl or naphthyl). Examples of the alkyl groups include methyl, ethyl, isopropyl, n-propyl, n-butyl, isobutyl, tert-butyl, n-pentyl, n-hexyl and n-octyl. $X_1$ preferably is a halide ion, especially $Cl^-$or $Br^-$.

Examples of the quaternary ammonium salts of the formula (II) include ammonium chloride, tetra-n-butylammonium bromide and triethylmethylammonium chloride.

The quaternary ammonium salt of the formula (III) is a dimmer of the quaternary ammonium salt, and the example includes hexamethoniumbromide [i.e., hexamethylenebis (trimethylammoniumbromide)].

Examples of the amines mentioned above include cyclohexylamine, trioctylamine and ethylenediamine.

Examples of the hydrazines mentioned above include dimethylhydradine.

Examples of the aromatic amines mentioned above include p-toluidine, N,N-dimethylaniline and N-ethylaniline.

Examples of the heterocyclic compounds mentioned above include N-methylpyrrole, N-ethylpyridinium bromide, imidazole, N-methylquinoliniumbromide and 2-methylbenzothiazole.

The heat sensitive ink layer generally contains 1 to 20 weight % of the nitrogen-containing compound, and especially 1 to 10 weight % of the compound. The compound preferably exists in the heat sensitive ink sheet in the amount of 0.01 to 2 g per 1 $m^2$.

The heat sensitive ink layer generally has a tensile strength at break of not more than 10 MPa (preferablly not less than 0.1 MPa), especially not more than 5 MPa. The heat sensitive ink layer having a tensile strength at break more than 10 MPa does not gives dots having even size and small size, and an image of satisfactory gradation on the shadow portion. Further, the heat sensitive ink layer preferably has a peeling force of not less than 3 dyn/mm at a peeling rate of the ink sheet in the direction parallel to a surface of the image receiving sheet from the image receiving sheet of 500 mm/min., after the ink sheet is pressed on the image receiving layer at such minimum energy that all the ink layer can be transferred onto the image receiving sheet.

The ink layer can further contain 1 to 20 weight % of additives such as a releasing agent and/or a softening agent based on the total amount of the ink layer so as to facilitate release of the ink layer from the support when the thermal printing (image forming) takes place and increase heat-sensitivity of the ink layer. Examples of the additives include a fatty acid (e.g., palmitic acid and stearic acid), a metal salt of a fatty acid (e.g., zinc stearate), a fatty acid derivative (e.g., fatty acid ester and its partial saponification product), a higher alcohol, a polyol derivative (e.g., ester of polyol), wax (e.g., paraffin wax, carnauba wax, montan wax, bees wax, Japan wax, and candelilla wax), low molecular weight polyolefin (e.g., polyethylene, polypropylene, and polybutyrene) having a viscosity mean molecular weight of approx. 1,000 to 10,000, low molecular weight copolymer of olefin (specifically α-olefin) with an organic acid (e.g., maleic anhydride, acrylic acid, and methacrylic acid) or vinyl acetate, low molecular weight oxidized polyolefin, halogenated polyolefin, homopolymer of acrylate or methacrylate (e.g., methacylate having a long alkyl chain such as lauryl methacrylate and stearyl methacrylate, and acrylate having a perfluoro group), copolymer of acrylate or methacrylate with vinyl monomer (e.g., styrene), low molecular weight silicone resin and silicone modified organic material (e.g., polydimethylsiloxane and polydiphenylsiloxane), cationic surfactant (e.g., pyridinium salt), anionic and nonionic surfactants having a long aliphatic chain group, and perfluoro-type surfactant.

The compounds are employed singly or in combination with two or more kinds.

The pigment can be appropriately dispersed in the amorphous organic polymer by conventional methods known in the art of paint material such as that using a suitable solvent and a ball mill. The nitrogen-containing compound and the additives can be added into the obtained dispersion to prepare a coating liquid. The coating liquid can be coated on the support according to a conventional coating method known in the art of paint material to form the heat-sensitive ink layer.

The thickness of the ink layer should be in the range of 0.2 to 1.0 μm, and preferably in the range of 0.3 to 0.6 μm (more preferably in the range of 0.3 to 0.5 μm). An excessively thick ink layer having a thickness of more than 1.0 μm gives an image of poor gradation on the shadow portion and highlight portion in the reproduction of image by area gradation. A very thin ink layer having a thickness o less than 0.2 μm cannot form an image of acceptable optical reflection density.

The heat-sensitive ink layer of the invention mainly comprises a pigment and an amorphous organic polymer, and the amount of the pigment in the layer is high, as compared with the amount of the pigment in the conventional ink layer using a wax binder. Therefore, the ink layer of the invention shows a viscosity of higher than $10^4$ cps at 150° C. (the highest thermal transfer temperature), while the conventional ink layer shows a viscosity of $10^2$ to $10^3$ cps at the same temperature. Accordingly, when the ink layer of the invention is heated, the ink layer per se is easily peeled from the support and transferred onto an image receiving layer keeping the predetermined reflection density. Such peeling type transfer of the extremely thin ink layer enables to give an image having a high resolution, a wide gradation from a shadow potion to a highlight portion, and satisfactory edge sharpness. Further, the complete transfer (100%) of image onto the image receiving sheet gives desired uniform reflection density even in a small area such as characters of 4 point and a large area such as a solid portion.

As for the image receiving sheet, any of the conventional sheet materials can be employed. For instance, a synthetic paper sheet which becomes soft under heating, and other image receiving sheet materials described in U.S. Pat. No. 4,482,625, and U.S. Pat. No. 4,766,053, and U.S. Pat. No. 4,933,258 can be employed.

The image receiving sheet generally has a heat adhesive layer on a support.

The support of the image receiving sheet is made of material having chemical stability and thermostability and flexibility. If desired, the support is required to have a high transmittance at a wavelength of the light source using for the exposure. Examples of materials of the support include polyesters such as polyethylene terephthalate (PET); polycarbonate; polystyrene; cellulose derivatives such as cellulose triacetate, nitrocellulose and cellophane; polyolefins such as polyethylene and polypropylene; polyacrylonitrile; polyvinyl chloride; polyvinylidene chloride; polyacrylates such as PMMA (polymethyl methacrylate), polyamides such as nylon and polyimide. Further, a paper sheet on which a polyethylene film is laminated may be employed. Preferred is a polyethylene terephthalate film. The support preferably is a biaxially stretched polyethylene terephthalate film. The thickness of the support generally is in the range of 5 to 300 μm, and preferably in the range of 25 to 200 μm.

The image receiving sheet generally comprises the support, a first image receiving layer and a second image receiving layer provided on the first image receiving layer.

The first image receiving layer generally has Young's modulus of 10 to 10,000 kg·f/$cm^2$ at room temperature. Use of polymer having low Young's modulus gives cushioning characteristics to the image receiving layer, whereby transferring property is improved to give high recording sensibility, good quality of dot and satisfactory reproducibility of gradation. Further, even if dust or dirt is present between the heat sensitive ink sheet and the image receiving sheet which are superposed for recording, the recorded image (transferred image) hardly has defect due to the cushioning characteristics of the first image receiving sheet. Furthermore, when the image transferred onto the image receiving sheet is retransferred onto a white paper sheet for printing by applying pressure and heat, the re transferring is conducted while the first image receiving layer cushions variation of pressure depending upon unevenness of a surface of the paper sheet. Therefore, the image retransferred shows high bonding strength to the white paper sheet.

Young's modulus of the first image receiving layer preferably is 10 to 200 kg·f/$cm^2$ at room temperature. The first image receiving layer having Young's modulus of 10 to 200 kg·f/$cm^2$ shows excellent cushioning characteristics in the thickness of not more than 50 μm, and also shows good coating property. The first image receiving layer having Young's modulus of more than 10,000 kg·f/$cm^2$ shows poor cushioning characteristics and therefore needs extremely large thickness to improve cushioning characteristics. The first image receiving layer having Young's modulus of less than 10 kg·f/$cm^2$ shows tackiness on the surface, and therefore preferred coating property cannot be obtained.

Examples of polymer materials employed in the first image receiving layer include polyolefins such as polyethylene and polypropylene; copolymers of ethylene and other monomer such as vinyl acetate or acrylic acid ester; polyvinyl chloride; copolymers of vinyl chloride and other monomer such vinyl acetate or vinyl alcohol; copolymer of vinyl acetate and maleic acid; polyvinylidene chloride; copolymer containing vinylidene chloride; polyacrylate; polymethacrylate; polyamides such as copolymerized nylon and N-alkoxymethylated nylon; synthetic rubber; and chlorinated rubber. Preferred are polyvinyl chloride, copolymer of vinyl chloride and vinyl acetate, copolymer of vinyl chloride and vinyl alcohol and copolymer of vinyl acetate and maleic acid. The degree of polymerization preferably is in the range of 200 to 2,000.

The preferred polymer and copolymer are suitable for material of the first image receiving layer due to the following reason:

(1) The polymer and copolymer show no tackiness at room temperature. (2) The polymer and copolymer have low Young's modulus (modulus of elasticity). (3) Young's modulus can be easily controlled because the polymer and copolymer have a number of plasticizers showing good compatibility. (4) Bonding strength to other layer or film can be easily controlled because the polymer and copolymer have a polar group such as hydroxy or carboxy. The first image receiving layer may further contain other various polymer, surface-active agent, surface lubricant or agent for improving adhesion in order to control bonding strength between the first receiving sheet and the support or the second image receiving layer. Further, the first image receiving layer preferably contain a tacky polymer (tackifier) in a small amount to reduce Young's modulus, so long as the layer has no tackiness.

In the case that polyvinyl chloride or copolymer containing vinyl chloride unit is employed, an organic tin-type stabilizer such as tetrabutyltin or tetraoctyltin is preferably incorporated into the polymer or copolymer.

Of polymer materials employed in the first image receiving layer, polymer materials having a large Young's modulus preferably contain a plasticizer to supplement cushion characteristics. The plasticizer preferably has a molecular weight of not less than 1,000, because it does not tend to bleed out over the surface of the layer. The plasticizer having moved on a surface of the layer brings about occurrence of sticking or adhesion of dust or dirt. Further, the plasticizer preferably has a molecular weight of not more than 5,000, because it does not show sufficient compatibility with the polymer materials employed in the first image receiving layer or it lowers cushioning characteristics of the first image receiving layer so that a thickness of the first image receiving layer is needed to increase.

Examples of the plasticizers include polyester, multifunctional acrylate monomer (acrylate monomer having a number of vinyl groups such as acryloyl or methacryloyl group), urethane origomer and copolymers of a monomer having ethylene group and fatty acid vinyl ester or (meth) acrylic acid alkyl ester.

Examples of the polyester plasticizer include polyesters having adipic acid unit, phthalic acid unit, sebasic acid unit, trimellitic acid unit, pyromellitic acid unit, citric acid unit and epoxy group. Preferred are polyesters having phthalic acid unit and sebasic acid unit. Preferred examples of multifunctional acrylate monomers include hexafunctional acrylate and dimethacrylate monomers as shown below.

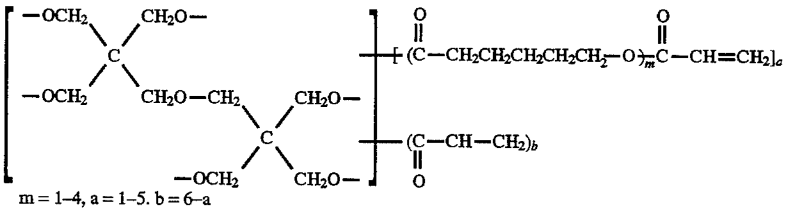

m = 1–4, a = 1–5. b = 6–a

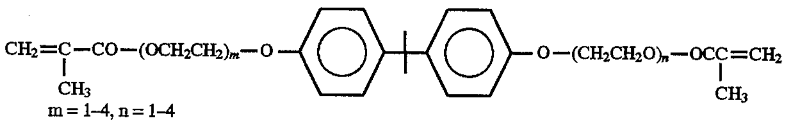

m = 1–4, n = 1–4

$CH_2{=}CH{-}CO{-}O{-}(CH_2CH_2O)_n{-}OC{-}CH{=}CH_2$ n = 1–4

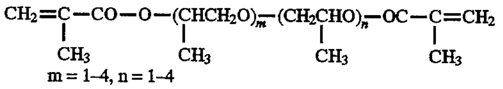

m = 1–4, n = 1–4

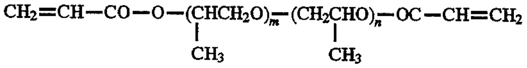

m = 1–4, n =1–4

Examples of the urethane origomers include polymers prepared from at least one of conventional polyisocyanates and at least one of conventional polyether diols or polyester diols, and polyfunctional urethane acrylates such as aromatic urethane acrylate and aliphatic urethane acrylates. Preferred examples are aromatic urethane acrylates and aliphatic urethane acrylates.

Example of copolymers of a monomer having ethylene group and fatty acid vinyl ester or (meth)acrylic acid alkyl ester include copolymers of ethylene and vinyl ester of fatty acid such as a saturated fatty acid (e.g., acetic acid, propionic acid, butyric acid or stearic acid), unsaturated fatty acid, carboxylic acid having cycloalkane, carboxylic acid having aromatic ring or carboxylic acid having heterocyclic ring. Examples of acrylic acid alkyl ester include methyl acrylate, ethyl acrylate, butyl acrylate, 2-ethylhexyl acrylate, methoxyethyl acrylate, methyl methacrylate, ethyl methacrylate, butyl methacrylate, hexyl methacrylate, decyloctyl methacrylate, lauryl methacrylate, stearyl methacrylate, dimethylaminoethyl methacrylate and methacrylamide. The above monomers copolymerized with the monomer having ethylene group can be employed singly or in two kinds or more depending upon desired property of the resultant polymer.

A supplemental binder such as acrylic rubber or linear polyurethane can be incorporated into the first image receiving layer, if desired. It is occasionally possible that incorporation of the binder reduces the amount of the plasticizer whereby the bleeding and sticking or adhesion of dust on the image receiving layer can be prevented.

A thickness of the first image receiving layer preferably is in the range of 1 to 50 μm, especially 5 to 30 μm. The thickness is determined by the following reasons: 1) the thickness should be larger than a depth of evenness of surface of the white paper sheet, 2) the thickness should be that capable of adsorbing a thickness of the overlapped portion of a number of color images, and 3) the thickness should have sufficient cushioning characteristics.

The image of the heat sensitive material which has been transferred on the second image receiving layer of the image receiving sheet having the first and second image receiving layers, is further retransferred onto the white paper sheet. In the procedure, the second image receiving layer is transferred on the white paper sheet together with the image. Hence, a surface of the image on the white paper sheet has a gloss analogous to that of a printed image with subjecting to no surface treatment such as matting treatment, due to the second image receiving layer provided on the image. Further, the second image receiving layer improves scratch resistance of the retransferred image.

The second image receiving layer preferably comprises butyral resin (polyvinyl butyral) and a polymer having at least one unit selected from recurring units represented by the following formula (IV):

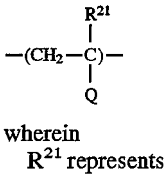

(IV)

wherein $R^{21}$ represents a hydrogen atom or a methyl group; and Q represents;

—$CONR^{22}R^{23}$, in which each of $R^{22}$ and $R^{23}$ independently represents a hydrogen atom, an alkyl group of 1 to 18 carbon atoms, an alkyl group of 1 to 18 carbon atoms which is substituted with at least one group or atom selected from the group consisting of hydroxyl, alkoxy of 1 to 6 carbon atoms, acetamide, halogen and cyano, an aryl group of 6 to 20 carbon atoms, an aryl group of 6 to 20 carbon atoms which is substituted with at least one group or atom selected from the group consisting of hydroxyl, alkoxy of 1 to 6 carbon atoms, halogen and cyano, an acyl group of 2 to 6 carbon atoms, a phenylsulfonyl group, a phenylsulfonyl group which is substituted with alkyl of 1 to 6 carbon atoms; or $R^{22}$ and $R^{23}$ is combined together with the nitrogen atom to form a 5–7 membered heterocyclic group (e.g., pyrrolidinyl, piperidino, piperazino or morpholino (residue of piperazine));

a nitrogen-containing heterocyclic group; or a group having the formula (V):

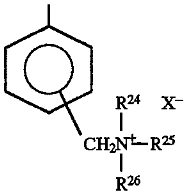

(V)

in which each of $R^{24}$, $R^{25}$ and $R^{26}$ independently represents an alkyl group of 1 to 25 carbon atoms, an alkyl group of 1 to 25 carbon atoms which is substituted with at least one group or atom selected from the group consisting of hydroxyl, alkoxy of 1 to 6 carbon atoms, halogen and cyano, an aralkyl group of 7 to 25 carbon atom, an aralkyl group of 7 to 25 carbon atoms which is substituted with at least one group or atom selected from the group consisting of hydroxyl, alkoxy of 1 to 6 carbon atoms, halogen and cyano, an aryl group of 6 to 25 carbon atoms, or an aryl group of 6 to 25 carbon atoms which is substituted with at least one group or atom selected from the group consisting of hydroxyl, alkoxy of 1 to 6 carbon atoms, halogen and cyano; and $X^-$ represents $Cl^-$, $Br^-$ or $I^-$.

The nitrogen-containing heterocyclic group preferably is an imidazolyl group, an imidazolyl group which is substituted with at least one group or atom selected from the group consisting of alkyl of 1 to 5 carbon atoms, aryl of 6 to 10 carbon atoms, halogen and cyano, a residue of pyrrolidone, a residue of pyrrolidone which is substituted with at least one group or atom selected from the group consisting of alkyl of 1 to 5 carbon atoms, aryl of 6 to 10 carbon atoms, halogen and cyano, a pyridyl group, a pyridyl group which is substituted with at least one group or atom selected from the group consisting of alkyl of 1 to 5 carbon atoms, aryl of 6 to 10 carbon atoms, halogen and cyano, a carbazolyl group, a carbazolyl group which is substituted with at least one group or atom selected from the group consisting of alkyl of 1 to 5 carbon atoms, aryl of 6 to 10 carbon atoms, halogen and cyano, a triazolyl group or a triazolyl group which is substituted with at least one group or atom selected from the group consisting of alkyl of 1 to 5 carbon atoms, aryl of 6 to 10 carbon atoms, halogen and cyano. Examples of the alkyl include methyl, ethyl and propyl. Examples of the aryl include phenyl and naphthyl.

Especially, the nitrogen-containing heterocyclic group is an imidazolyl group, an imidazolyl group which is substituted with at least one of alkyl groups of 1 to 5 carbon atoms, or an triazolyl group which is substituted with at least one of alkyl groups of 1 to 5 carbon atoms.

$R^{22}$ and $R^{23}$ of —$CONR^{22}R^{23}$ preferably is a hydrogen atom, an alkyl group of 1 to 10 carbon atom, an alkyl group of 1 to 10 carbon atom which is substituted with hydroxyl, acetamide, or alkoxy of 1 to 6 carbon atoms, an aryl group of 6 to 15 carbon atoms, or an aryl group of 6 to 15 carbon atoms which is substituted with hydroxy or alkoxy of 1 to 6 carbon atoms, an acyl group of 2 to 6 carbon atoms, a phenylsulfonyl group, a phenylsulfonyl group which is substituted with alkyl of 1 to 6 carbon atoms. Examples of the alkyl group include methyl, ethyl, isopropyl, n-propyl, n-butyl, isobutyl, tert-butyl, n-pentyl, n-hexyl, n-octyl, nonyl and decyl. Examples of the aryl group include phenyl and naphthyl. Examples of the acyl group include acetyl, propionyl, butyryl and isobutyryl. Examples of the alkoxy include methoxy, ethoxy, propoxy and butoxy.

Otherwise, $R^{22}$ and $R^{23}$ is preferably combined together with the nitrogen atom to form a 5–7 membered heterocyclic group (e.g., pyrrolidinyl, piperidino, piperazino or morpholino (residue of piperazine). $R^{22}$ and $R^{23}$ may be combined to form alkylene of 2 to 20 carbon atom which has straight or branched chain, alkylene of 2 to 20 carbon atom which has straight or branched chain and has at least one group selected from —O—, —OCO— and —COO— in the group.

In the group having the formula (II) which is a group represented by "Q", each of $R^{24}$, $R^{25}$ and $R^{26}$ preferably is an alkyl group of 1 to 20 carbon atom, an alkyl group of 1 to 20 carbon atom which is substituted with at least one group selected from alkoxy of 1 to 6 carbon atom, halogen and cyano, an aralkyl group of 7 to 18 carbon atom, an aralkyl group of 7 to 18 carbon atoms which is substituted with at least one group selected from alkoxy of 1 to 6 carbon atom, halogen and cyano, an aryl group of 6 to 20 carbon atoms, or an aryl group of 6 to 20 carbon atoms which is substituted with at least one group selected from alkoxy of 1 to 6 carbon atom, halogen and cyano; and $X^-$ represents $Cl^-$, $Br^-$ or $I^-$. Examples of the alkyl groups include methyl, ethyl, isopropyl, n-propyl, n-butyl, isobutyl, tert-butyl, n-pentyl, n-hexyl, n-octyl, nonyl and decyl. Examples of the aryl group include phenyl and naphthyl. Examples of the aralkyl group include benzyl and phenethyl. Examples of the alkoxy include methoxy, ethoxy, propoxy and butoxy.

Examples of monomers employed for forming a recurring unit represented by the formula (IV) wherein Q represents a group of —CONR$^{22}$R$^{23}$ or a nitrogen-containing heterocyclic group, include (meth)acrylamide, N-alkyl (meth) acrylamide (examples of alkyl: methyl, ethyl, propyl, n-butyl, tertbutyl, heptyl, octyl, ethylhexyl, cyclohexyl, hydroxyethyl and benzyl) , N-aryl (meth)acrylamide (examples of aryl: phenyl, tolyl, nitrophenyl, naphthyl and hydroxy phenyl), N,N-dialkyl (meth)acrylamide (examples of alkyl: methyl, ethyl, propyl, n-butyl, iso-butyl, ethylhexyl and cyclohexyl), N,N-diaryl (meth)acrylamide (example of aryl: phenyl), N-methyl-N-phenyl(meth)acrylamide, N-hydroxyethyl-N-methyl(meth)acrylamide, N-2-acetoamideethyl-N-acetyl-(meth)acrylamide, N-(phenylsulfonyl) (meth)acrylamide, N-(p-methylphenylsulfonyl) (meth)acrylamide, 2-hydroxyphenylacrylamide, 3-hydroxyphenylacrylamide, 4-hydroxyphenylacrylamide, (meth)acryloylmorpholin, 1-vinylimidazole, 1-vinyl-2-methylimidazole, 1-vinyltriazole, 1-vinyl-3,5-dimethylimidazole, vinylpyrrolidone, 4-vinylpyridine and vinylcarbazole.

Examples of monomers employed for forming a recurring unit represented by the formula (IV) wherein Q represents a group having the formula (V) include N,N,N-(trialkyl)-N-(styrylmethyl)-ammonium chloride, N,N,N-(trialkyl)-N-(styrylmethyl)-ammonium bromide, N,N,N-(trialkyl)-N-(styrylmethyl)-ammonium iodide (examples of alkyl: methyl, ethyl, propyl, n-butyl, tert-butyl, heptyl, hexyl, octyl, iso-octyl, dodecyl, ethylhexyl and cyclohexyl), N,N-(dimethyl)-N-(dodecyl)-N-(styrylmethyl)-ammonium chloride, N,N-(dimethyl)-N-(benzyl)-N-(styrylmethyl)-ammonium chloride, N,N,N-(trimethoxyethyl)-N-(styrylzz-methyl)-ammonium chloride and N,N-(dimethyl)-N-(phenyl)-N-(styrylmethyl)-ammonium chloride.

Examples of monomers copolymerizable with monomers employed for forming a recurring unit represented by the formula (IV) include (meth)acrylic acid esters (i.e., acrylic acid esters and methacrylic acid esters) such as alkyl (meth) acrylates and substituted-alkyl (meth)acrylates (e.g., methyl (meth)acrylate, ethyl (meth)acrylate, n-propyl (meth) acrylate, iso-propyl (meth)acrylate, butyl (meth)acrylate, amyl (meth)acrylate, hexyl (meth)acrylate, cyclohexyl (meth)acrylate, ethylhexyl (meth)acrylate, octyl (meth) acrylate, tert-octyl (meth)acrylate, chloroethyl (meth) acrylate, allyl (meth)acrylate, 2-hydroxy (meth)acrylate, 2-hydroxypropyl (meth)acrylate, 4-hydroxybutyl (meth) acrylate, 2,2-dimethyl-3-hydroxypropyl (meth)acrylate, 5-hydroxypentyl (meth)acrylate, trimethylolpropane mono (meth)acrylate, pentaerithritol mono(meth)acrylate, benzyl (meth)acrylate, methoxybenzyl (meth)acrylate, chlorobenzyl (meth)acrylate, furfuryl (meth)acrylate, tetrahydrofurfuryl (meth)acrylate and phenoryethyl (meth) acrylate, and aryl (meth)acrylates (e.g., phenyl (meth) acrylate, cresyl (meth)acrylate and naphthyl (meth) acrylate); styrenes such as styrene and alkylstyrenes (e.g., methylstyrene, dimethylstyrene, trimethylstyrene, ethylstyrene, diethylstyrene, isopropylstyrene, butylstyrene, hexylstyrene, cyclohexylstyrene, decylstyrene, benzylstyrene, chloromethylstyrene, trifluoromethylstyrene, ethoxymethylstyrene and acetoxymethylstyrene), alkoxystyrenes (e.g., methoxystyrene, 4-methoxy-3-methylstyrene and dimethoxystyrene), halogenostyrenes (e.g., chlorostyrene, dichlorostyrene, trichlorostyrene, pentachlorostyrene, bromostyrene, dibromostyrene, iodostyrene, fluorostyrene, trifluorostyrene, 2-bromo-4-trifluorostyrene and 4-fluoro-3-trifluoromethylstyrene) and hydroxystyrene; crotonic acid esters such as alkyl crotonares (e.g., butyl crotonate, hexyl crotonate, glycerol monocrotonate); acids having a vinyl group such as (meth) acrylic acid, crotonic acid and itaconic acid; and acrylonitrile.

Examples of polymers having at least one unit selected from recurring units represented by the formula (IV), include N,N-dimethyl acrylamide/butyl (meth)acrylate copolymer, N,N-dimethyl (meth)acrylamide/2-ethylhexyl (meth)acrylate copolymer, N,N-dimethyl (meth)acrylamide/hexyl (meth)acrylate copolymer, N-butyl (meth)acrylamide/butyl (meth)acrylate copolymer, N-butyl (meth)acrylamide/2-ethyl-hexyl (meth)acrylate copolymer, N-butyl (meth) acrylamide/hexyl (meth)acrylate copolymer, (meth) acryloylmorpholin/butyl (meth)acrylate copolymer, (meth) acryloylmorpholin/2-ethylhexyl (meth)acrylate copolymer, (meth)acryloylmorpholine/hexyl (meth)acrylate copolymer, 1-vinylimidazole/butyl (meth)acrylate copolymer, 1-vinylimidazole/2-ethyl-hexyl (meth)acrylayte copolymer, 1-vinylimidazole/hexyl (meth)acrylayte copolymer; N,N-dimethylacrylamide/butyl (meth)acrylate/N,N,N-(trihexyl)-N-(styrylmethyl)-ammonium chloride copolymer, N,N-dimethylacrylamide/butyl (meth)acrylate/N,N,N-(trioctyl)-N-(styrylmethyl)-ammonium chloride copolymer, N,N-dimethylacrylamide/butyl (meth)acrylate/N,N,N-(tridecyl)-N-(styrylmethyl)-ammonium chloride copolymer, N,N-dimethylacrylamide/butyl (meth)acrylate/N,N,N-(trihexyl)-N-(styrylmethyl)-ammonium iodide copolymer, N,N-dimethyl (meth)acrylamide/hexyl (meth)acrylate/N,N,N-(trihexyl)-N-(styrylmethyl)-ammonium chloride copolymer, (meth)acryloylmorpholin/2-ethylhexyl (meth)acrylate/N,N-(dimethyl)-N-(benzyl)-N-(styrylmethyl)ammonium chloride copolymer, N-butyl (meth)acrylamide/hexyl (meth) acrylate/N,N,N-(trimethoxyethyl)-N-(styrylmethyl)-ammonium chloride copolymer, and N,N,N-(trihexyl)-N-(styrylmethyl)-ammonium chloride polymer.

The polymer having recurring unit of the formula (IV) preferably contains the recurring unit in the amount of 10 to 100 molar %, especially in the amount of 30 to 80 molar When the amount of the recurring unit is not less than 10 molar %, the transferred image shows low quality. Weight-average molecular weight of the polymer preferably is in the range of 1,000 to 200,000, especially 2,000 to 100,000. The molecular weight of less than 2,000 renders its preparation difficult, and the molecular weight of more than 200,000 reduces solubility of the polymer in a solvent.

The second image receiving layer may contain various polymers other than butyral resin and the polymer having recurring unit of the formula (IV). Examples of these polymers include polyolefins such as polyethylene and polypropylene; copolymers of ethylene and other monomer such as vinyl acetate or acrylic acid ester; polyvinyl chloride; copolymers of vinyl chloride and other monomer such vinyl acetate; copolymer containing vinylidene chloride; polystyrene; copolymer of styrene and other monomer such as maleic acid ester; polyvinyl acetate; butyral resin; modified polyvinyl alcohol; polyamides such as copolymerized nylon and N-alkoxymethylated nylon; synthetic rubber; chlorinated rubber; phenol resin; epoxy resin; urethane resin; urea resin; melamine resin; alkyd resin; maleic acid resin; copolymer containing hydroxystyrene; sulfonamide resin; rosin ester; celluloses; and rosin.

The polymer having a recurring unit of the formula (IV) is generally contained in the amount of 5 to 50 weight % based on the total amount of the polymers, and preferably 10 to 30 weight %.

The second image receiving layer can contain a surface-active agent, surface lubricant, plasticizer or agent for improving adhesion in order to control bonding strength between the second image receiving sheet and the first image receiving layer or the heat sensitive ink layer. Further, it is preferred to employ a solvent not to dissolve or swell the resin contained in the first image receiving layer as a solvent used in a coating liquid for forming the second image receiving layer. For example, when polyvinyl chloride, which easily dissolves in various solvents, is used as a resin of the first image receiving layer, a solvent used in the coating liquid of the second image receiving layer preferably is alcohols or solvents mainly containing water.

A thickness of the second receiving layer preferably is in the range of 0.1 to 10 μm, especially 0.5 to 5.0 μm. The thickness exceeding 10 μm damages unevenness of the transferred image derived from an uneven surface of the white paper sheet (onto which the image on the image receiving sheet is retransferred) and therefore the transferred image is not near to a printed image due to its high gloss.

In order to control the bonding strength between the first and second image receiving layers, materials contained in the first and second image receiving layers are generally different from each other mentioned above; for example, the materials are used in combination of hydrophilic polymer and liophilic polymer, in combination of polar polymer and nonpolar polymer, or as the materials additives such as surface-active agent, surface lubricant such as a fluorine compound or silicone compound, plasticizer or agent for improving adhesion such as silan coupling agent are appropriately used.

On the second image receiving layer, a lubricating layer (overcoating layer) can be provided to improve lubricating property and scratch resistance of a surface of the second image receiving layer.

Examples of materials forming the layer include a fatty acid (e.g., palmitic acid or stearic acid), a metal salt of a fatty acid (e.g., zinc stearate), a fatty acid derivative (e.g., fatty acid ester, its partial saponification product or fatty acid amide), a higher alcohol, a polyol derivative (e.g., ester of polyol), wax (e.g., paraffin wax, carnauba wax, montan wax, bees wax, Japan wax, or candelilla wax), polydimethylsiloxane and polydiphenylsiloxane), cationic surfactant (e.g., ammonium salt having long aliphatic chain group or pyridinium salt), anionic and nonionic surfactants having a long aliphatic chain group, and perfluoro-type surfactant.

An intermediate layer can be provided between the first and second image receiving layers. In order to control transferring property.

Subsequently, the image forming method of the invention is described below.

The image forming method (thermal transfer recording) of the invention can be, for example, performed by means of a thermal head (generally using as thermal head printer) and a laser beam using the heat sensitive ink sheet of the invention and the above image receiving sheet.

The method utilizing the thermal head can be conducted by the steps of: superposing the heat sensitive ink sheet having the heat sensitive ink layer of the invention on the image receiving sheet; placing imagewise a thermal head the support of the heat sensitive ink sheet to form and transfer an image of the heat sensitive ink material of the ink layer onto the image receiving sheet (generally the second image receiving layer) by separating the support from the image receiving sheet. The formation of the image using the thermal head is generally carried out utilizing area gradation. The transferred image onto the image receiving layer has an optical reflection density of at least 1.0.

Subsequently, the following procedure can be performed. After a white paper sheet is prepared, the image receiving sheet having the transferred image is superposed on a white sheet, which generally is a support for printing, such a manner that the transferred image is contact with a surface of the white sheet, and the composite is subjected to pressing and heating treatments, and the image receiving sheet (having the first image receiving layer) is removed from the composite whereby the retransferred image can be formed on the white paper sheet (together with the second image receiving layer). The transferred image onto the white sheet has an optical reflection density of at least 1.0.

The above formation of the image can be generally conducted using the thermal head printer by means of area gradation.

Further, the method utilizing the a laser beam can be conducted using a laser beam instead of the above thermal head. The thermal transfer recording method utilizing the a laser beam can utilize methods (i.e., ablation method) described in U.S. Pat. No. 5,352,562 and Japanese Patent Provisional Publication No. 6(1994)-219052. The method of Japanese Patent Provisional Publication No. 6(1994)-219052 is performed by the steps of: superposing a heat sensitive ink sheet comprising a support and a heat sensitive ink layer (image forming layer) between which a light-heat conversion layer capable of converting an absorbed laser beam into heat energy and a heat sensitive peeling layer containing heat sensitive material capable of producing a gas by absorbing the heat energy (or only a light-heat conversion layer further containing the heat sensitive material) are provided on the image receiving sheet in such a manner that the heat sensitive ink layer is contact with a surface of the image receiving sheet; irradiating imagewise a laser beam the composite (the heat sensitive ink sheet and the image receiving sheet) to enhance temperature of the light-heat conversion layer; causing ablation by decomposition or melting of materials of the light-heat conversion layer and decomposing a portion of the heat sensitive peeling layer to produce a gas, whereby bonding strength between the heat sensitive ink layer and the light-heat conversion layer reduces; and transferring the heat sensitive ink layer corresponding to the portion onto the image receiving layer.

The above formation of the image utilizing the ablation can be generally carried out by means of area gradation. The transferred image on the image receiving sheet has also an optical reflection density of at least 1.0. Further, the transferred image can be retransferred onto the white paper sheet, and the retransferred image on the white paper sheet has an optical reflection density of at least 1.0.

Otherwise, in the above method utilizing the ablation, formation of the image can be also conducted by the steps of portionwise melting the heat sensitive ink layer by means of heat energy given by absorption of a laser beam, and transferring the portion onto the image receiving sheet under melting.

The light-heat conversion layer and heat sensitive peeling layer mentioned above are explained below.

The light-heat conversion layer basically comprises a coloring material (e.g., dye or pigment) and a binder.

Examples of the coloring material include black pigments such as carbon black, pigments of large cyclic compounds such as phthalocyanine and naphthalocyanine absorbing a light having wavelength from visual region to infrared region, organic dyes such as cyanine dyes (e.g., indolenine compound), anthraquinone dyes, azulene dyes and phthalocyanine dyes, and dyes of organic metal compounds such as dithiol nickel complex. The light-heat conversion layer preferably is as thin as possible to enhance recording sensitivity, and therefore dyes such as phthalocyanine and naphthalocyanine having a large absorption coefficient are preferably employed.

Examples of the binder include homopolymer or copolymer of acyrylic monomers such as acrylic acid, methacrylic acid, acrylic acid ester and methacrylic acid ester; celluloses such as methyl cellulose, ethyl cellulose and cellulose acetate; vinyl polymers such as polystyrene, vinyl chloride/vinyl acetate copolymer, polyvinyl pyrrolidone, polyvinyl butyral and polyvinyl alcohol; polycondensation polymers such as polyester and polyamide; and thermoplastic polymers containing rubber butadiene/styrene copolymer. Otherwise, the binder may be a resin formed by polymeization or cross-linkage of monomers such as epoxy compounds by means of light or heating.

A ratio between the amount of the coloring material and that of the binder preferably is in the range of 1:5 to 10:1 (coloring material:binder), especially in the range of 1:3 to 3:1. When the amount of the binder is more than the upper limit, cohesive force of the light-heat conversion layer lowers and therefore the layer is apt to transfer onto the image receiving sheet together with the heat sensitive ink layer in the transferring procedure. Further, the light-heat conversion layer containing excess binder needs a large thickness to show a desired light absorption, which occasionally results in reduction of sensitivity.

The thickness of the light-heat conversion layer generally is in the range of 0.05 to 2 μm, and preferably 0.1 to 1 μm. The light-heat conversion layer preferably shows light absorption of not less than 70% in a wavelength of a used laser beam.

The heat sensitive peeling layer is a layer containing a heat sensitive material. Examples of the material include a compound (e.g., polymer or low-molecular weight compound) which is itself decomposed or changed by means of heating to produce a gas; and a compound (e.g., polymer or low-molecular weight compound) in which a relatively volatile liquid such as water has been adsorbed or absorbed in marked amount. These compounds can be employed singly or in combination of two kinds.

Examples of the polymers which are itself decomposed or changed by means of heating to produce a gas include self-oxidizing polymers such as nitrocellulose; polymers containing halogen atom such as chlorinated polyolefin, chlorinated rubber, polyvinyl chloride and polyvinylidene chloride; acrylic polymers such as polyisobutyl methacylate in which relatively volatile liquid such as water has been adsorbed; cellulose esters such as ethyl cellulose in which relatively volatile liquid such as water has been adsorbed; and natural polymers such as gelatin in which relatively volatile liquid such as water has been adsorbed.

Examples of the low-molecular weight compounds which are itself decomposed or changed by means of heating to produce a gas include diazo compounds and azide compounds.

These compounds which are itself decomposed or changed preferably produce a gas at a temperature not higher than 280° C., especially produce a gas at a temperature not higher than 230° C. (preferably a temperature not lower than 100° C.).

In the case that the low-molecular weight compound is employed as the heat sensitive material of the heat sensitive peeling layer, the compound is preferably employed together with the binder. The binder may be the polymer which itself decomposes or is changed to produce a gas or a conventional polymer having no property mentioned above. A ratio between the low-molecular weight compound and the binder preferably is in the range of 0.02:1 to 3:1 by weight, especially 0.05:1 to 2:1.

The heat sensitive peeling layer is preferably formed on the whole surface of the light-heat conversion layer. The thickness preferably is in the range of 0.03 to 1 μm, especially 0.05 to 0.5 μm.

The present invention is further described by the following Examples and Comparison Examples.

[EXAMPLE]

[Synthetic example 1]

Synthesis of N-methylstearic amide

To 500 cc of acetone was added 15.5 g of methylamine to form a mixture. 60.0 g of stearoyl chloride was drop-wise added to the mixture, while the mixture was stirred and cooled using ice water. The addition was conducted at a temperature of not higher than 20° C. Further, 20.2 g of triethylamine was dropwise added to the mixture at a temperature of not higher than 20° C. After the addition was complete, the mixture was allowed to react for 3 hours. The reaction mixture was then poured into water and the aqueous mixture was filtered to collect produced crystals, and the crystals were recrystallized from a mixed solvent of ethyl acetate and methanol to give a white crystalline product of N-methylstearic amide (Amide compound No. 1 mentioned above).

[Synthetic examples 2–10]

The procedures of Synthetic example 1 were repeated except for changing the combination of the amine and acyl halide to prepare amide compounds set forth in Table 3.

Examples of the amide compounds shown in Table 3 are indicated by $R^1$, $R^2$ and $R^3$ of the formula (I).

TABLE 3

| Amide Compound No. | $R^1$ | $R^2$ | $R^3$ | m.p. (°C.) |
|---|---|---|---|---|
| No. 1 | n-$C_{17}H_{35}$ | $CH_3$ | H | 78 |
| No. 2 | n-$C_{17}H_{35}$ | $C_2H_5$ | H | 68 |
| No. 3 | n-$C_{17}H_{35}$ | n-$C_4H_9$ | H | 67 |
| No. 4 | n-$C_{17}H_{35}$ | n-$C_6H_{13}$ | H | 67 |
| No. 5 | n-$C_{17}H_{35}$ | n-$C_8H_{17}$ | H | 73 |
| No. 6 | n-$C_{17}H_{35}$ | $C_2H_4OC_2H_4OH$ | H | 59 |
| No. 7 | n-$C_{17}H_{35}$ | $CH_3$ | $CH_3$ | 34 |
| No. 8 | n-$C_{17}H_{35}$ | $C_2H_5$ | $C_2H_5$ | ≦30 |
| No. 9 | $CH_3(CH_2)_5CH(OH)\ (CH_2)_{10}$ | $C_2H_4OH$ | H | 105 |
| No. 10 | $CH_3(CH_2)_5CH(OH)\ (CH_2)_{10}$ | H | H | 110 |

EXAMPLE 1

(1) Preparation of heat sensitive ink sheet

The following three pigment dispersions were prepared:

| | |
|---|---|
| A) Cyan pigment dispersion | |
| Cyan Pigment (CI, P.B. 15:4) | 12.0 g |
| Binder solution | 122.8 g |
| B) Magenta pigment dispersion | |
| Magenta Pigment (CI, P.R. 57:1) | 12.0 g |
| Binder solution | 122.8 g |
| C) Yellow pigment dispersion | |
| Yellow Pigment (CI, P.Y. 14) | 12.0 g |
| Binder solution | 122.8 g |

The binder solution comprised the following components:

| | |
|---|---|
| Butyral resin (softening point: 57° C., Denka Butyral #2000-L, available from Denki Kagaku Kogyo K.K.) | 12.0 g |
| Solvent (n-propyl alcohol) | 110.0 g |
| Dispersing agent (Solsparese S-20000, available from ICI Japan Co., Ltd.) | 0.8 g |

Figure 2:
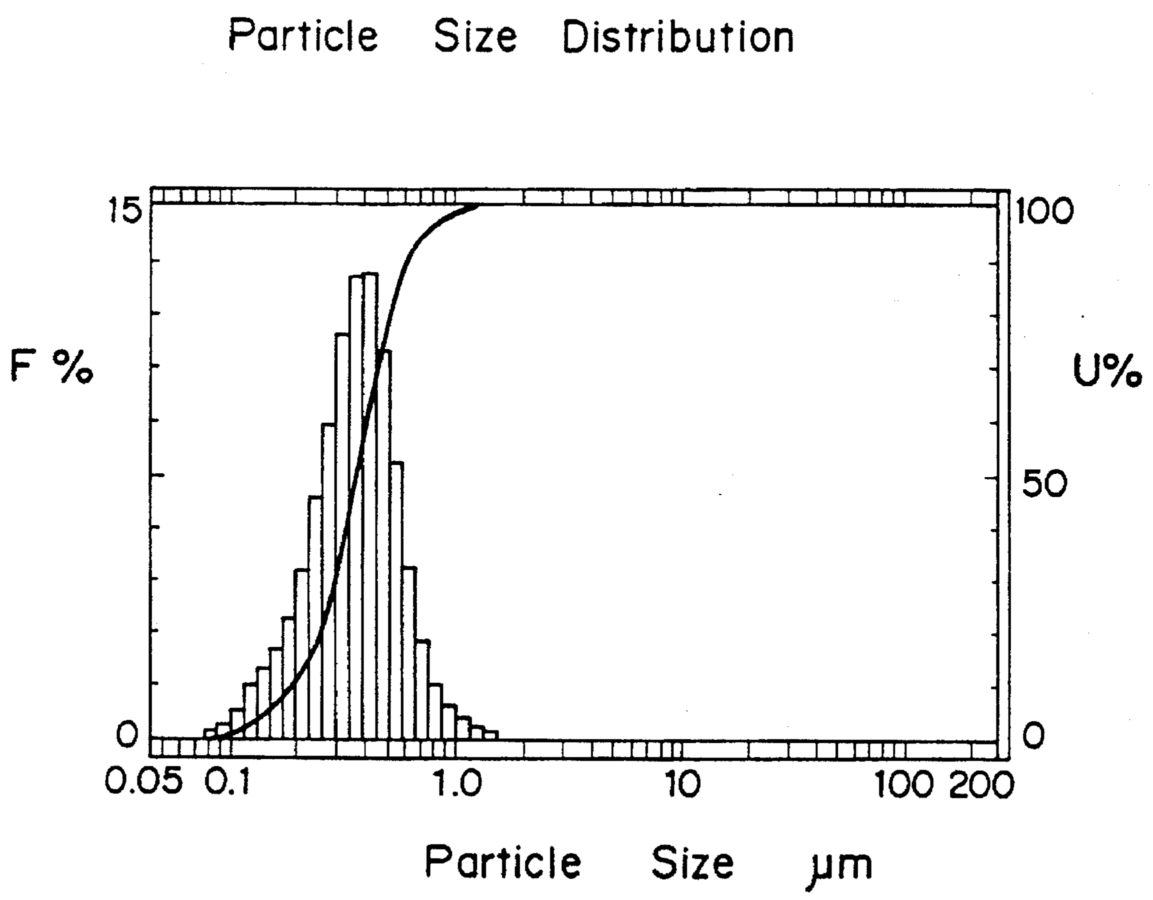
FIG. 2 shows a particle size distribution of magenta pigment employed in Example 1.

The particle size distribution of the pigments in the dispersions are shown in the attached figures, wherein FIG. 1 indicates the distribution of cyan pigment; FIG. 2 indicates the distribution of magenta pigment; and FIG. 3 indicates the distribution of yellow pigment. In each figure, the axis of abscissas indicates particle size (μm), the left axis of ordinates indicates percentage (%) of particles of the indicated particle sizes, and the right axis of ordinates indicates accumulated percentage (%).

Figure 3:
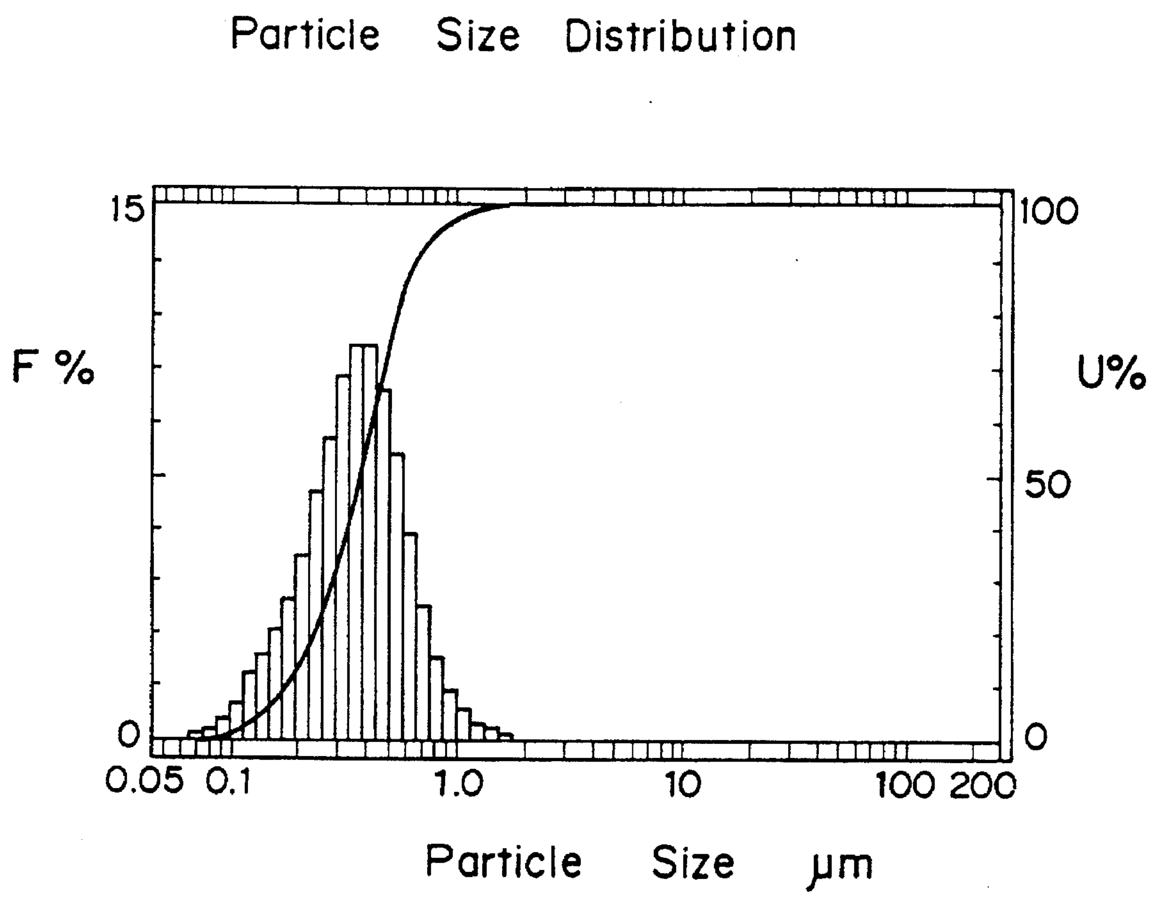
FIG. 3 shows a particle size distribution of yellow pigment employed in Example 1.

In FIG. 1, a meadian size of the particles is 0.154 μm, the specific surface is 422,354 $cm^2/cm^3$, and 90% of the total particels have particle sizes of not less than 0.252 μm. In FIG. 2, a meadian size of the particles is 0.365 μm, the specific surface is 189,370 $cm^2/cm^3$, and 90% of the total particels have particle sizes of not less than 0.599 μm. In FIG. 3, a meadian size of the particles is 0.364 μm, the specific surface is 193,350 $cm^2/cm^3$, and 90% of the total particels have particle sizes of not less than 0.655 μm.

To 10 g of each pigment dispersion were added 0.24 g of the amide compound No. 3 synthesized above and 60 g of n-propyl alcohol to give a coating liquid. Each of thus obtained coating liquids [A), B) and C) corresponding to the pigment dispersions A), B) and C)] was coated using a whirler on a polyester film (thickness: 5 μm, available from Teijin Co., Ltd.) with a back surface having been made easily releasable. Thus, a cyan ink sheet having a support and a cyan ink layer of 0.36 μm, a magenta ink sheet having a support and a magenta ink layer of 0.38 μm, and a yellow ink sheet having a support and a yellow ink layer of 0.42 μm, were prepared.

(2) Preparation of image receiving sheet

The following coating liquids for first and second image receiving layers were prepared:

| | |
|---|---|
| (Coating liquid for first image receiving layer) | |
| Vinyl chloride/vinyl acetate copolymer (MPR-TSL, available from Nisshin Kagaku Co., Ltd.) | 25 g |
| Dibutyloctyl phthalate (DOP, Daihachi Kagaku Co., Ltd.) | 12 g |
| Surface active agent (Megafack F-177, available from Dainippon Ink & Chemicals Inc.) | 4 g |
| Solvent (Methyl ethyl ketone) | 75 g |
| (Coating liquid for second image receiving layer) | |
| Butyral resin (Denka Butyral #2000-L, available from Denki Kagaku Kogyo K.K.) | 16 g |
| N,N-dimethylacrylamide/butyl acrylate copolymer | 4 g |
| Surface active agent (Megafack F-177, available from Dainippon Ink & Chemicals Inc.) | 0.5 g |
| Solvent (n-propyl alcohol) | 200 g |

The above coating liquid for first image receiving layer was coated on a polyethylene terephthalate film (thickness: 100 μm) using a whirler rotating at 300 rpm, and dried for 2 minutes in an oven of 100° C. to form a first image receiving layer (thickness: 20 μm) on the film.

Subsequently, the above coating liquid for second image receiving layer was coated on the first image receiving layer using a whirler rotating at 200 rpm, and dried for 2 minutes in an oven of 100° C. to form a second image receiving layer (thickness: 2 μm).

Initially, the cyan heat sensitive ink sheet was superposed on the image receiving sheet, and a thermal head was placed on the cyan ink sheet side for imagewise forming a cyan image by the known divided sub-scanning method. The divided sub-scanning method was performed with multiple modulation for giving area gradation by moving a thermal head of 75 μm×50 μm in one direction at a pitch of 3 μm along 50 μm length. The support (polyester film) of the cyan ink sheet was then peeled off from the image receiving sheet on which a cyan image with area gradation was maintained. On the image receiving sheet having the cyan image was superposed the magenta ink sheet, and the same procedure was repeated for forming a magenta image with area gradation on the image receiving sheet having the cyan image.

The yellow ink sheet was then superposed on the image receiving sheet having the cyan and magenta images thereon in the same manner, and the same procedure was repeated for forming a yellow image with area gradation on the image receiving sheet. Thus, a multicolor image was formed on the image receiving layer.

Subsequently, an art paper sheet was placed on the image receiving sheet having the multicolor image, and they were passed through a couple of heat rollers under conditions of 130° C., 4.5 kg/cm and 4 m/sec. Then, the polyethylene terephthalate film of the image receiving sheet was peeled off from the art paper sheet to form a multicolor image having the second image receiving layer on the art paper sheet. Thus obtained multicolor image showed high approximation to that of chemical proof (Color Art, available from Fuji Photo Film Co., Ltd.) prepared from a lith manuscript.

The following is optical reflection density of a solid portion of each color image:

Cyan image: 1.53

Magenta image: 1.43

Yellow image 1.58

The optical reflection density on characters of 4 points which was measured by means of a microdensitometer was almost the same as above.

The gradation reproduction was observed in the range of 5% to 95%, and the obtained dot showed preferable shape and no defects.

Further, the multicolor image precisely followed unevenness of the art paper sheet to have a matted surface. Therefore, the surface gloss of the multicolor image showed extremely high approximation to that of print.

The results of these evaluation are set forth in Table 4.

EXAMPLE 2

The procedures of Example 1 were repeated except for changing 0.24 g of the amide compound No. 3 to 0.24 g of the amide compound No. 7 synthesized above to prepare heat sensitive ink sheets (cyan ink sheet, magenta ink sheet and yellow ink sheet).

A multicolor image was prepared in the same manner as Example 1 using the heat sensitive ink sheets and the image receiving sheet prepared in the same manner as Example 1. The resultant multicolor image was retransferred onto an art paper sheet in the same manner as Example 1.

Optical reflection density of a solid portion of each color image was the same as Example 1. The results of other evaluations are set forth in Table 4.

EXAMPLE 3

The procedures of Example 1 were repeated except for changing 0.24 g of the amide compound No. 3 to 0.24 g of the amide compound No. 9 synthesized above to prepare heat sensitive ink sheets (cyan ink sheet, magenta ink sheet and yellow ink sheet).

A multicolor image was prepared in the same manner as Example 1 using the heat sensitive ink sheets and the image receiving sheet prepared in the same manner as Example 1. The resultant multicolor image was retransferred onto an art paper sheet in the same manner as Example 1.

Optical reflection density of a solid portion of each color image was the same as Example 1. The results of other evaluations are set forth in Table 4.

EXAMPLE 4

The procedures of Example 1 were repeated except for changing 0.24 g of the amide compound No. 3 to 0.24 g of the amide compound No. 10 synthesized above to prepare heat sensitive ink sheets (cyan ink sheet, magenta ink sheet and yellow ink sheet).

A multicolor image was prepared in the same manner as Example 1 using the heat sensitive ink sheets and the image receiving sheet prepared in the same manner as Example 1. The resultant multicolor image was retransferred onto an art paper sheet in the same manner as Example 1.

Optical reflection density of a solid portion of each color image was the same as Example 1. The results of other evaluations are set forth in Table 4.

COMPARISON EXAMPLE 1

The procedures of Example 1 were repeated except for using no the amide compound No. 3 to prepare heat sensitive ink sheets (cyan ink sheet, magenta ink sheet and yellow ink sheet).

A multicolor image was prepared in the same manner as Example 1 using the heat sensitive ink sheets and the image receiving sheet prepared in the same manner as Example 1. The resultant multicolor image was retransferred onto an art paper sheet in the same manner as Example 1.

Optical reflection density of a solid portion of each color image was the same as Example 1. The results of other evaluations are set forth in Table 4.

As for the multicolor images, the evaluations of gradation reproduction, shape of dot and approximation to printed image were ranked based on evaluation of multicolor image (DD) obtained in Comparison Example 1, as follows:

(Shape of dot)

AA: Sufficiently satisfactory compared with dot forming multicolor image of Comparison Example 1

BB: satisfactory compared with dot forming multicolor image of Comparison Example 1

(Gradation reproduction)

AA: Excellent compared with gradation reproduction of multicolor image of Comparison Example 1

BB: Good compared with gradation reproduction of multicolor image of Comparison Example 1

(Approximation to printed image)

AA: Very high compared with approximation to printed image multicolor image of Comparison Example 1

BB: High compared with approximation to printed image multicolor image of Comparison Example 1

TABLE 4

| Nitrogen-containing Compound No. | | Shape of Dot | Reproductivity of Gradation | Approximation to Printed image |
|---|---|---|---|---|
| Ex. 1 | No. 3 | BB | BB | BB |
| Ex. 2 | No. 7 | BB | BB | BB |
| Ex. 3 | No. 9 | AA | AA | BB |
| Ex. 4 | No. 10 | BB | AA | BB |
| Co. Ex. 1 | — | DD | DD | DD |

Subsequently, as to each of the heat sensitive ink layers of the heat sensitive ink sheets (Examples 1 to 4), tensile strength at break was measured as follows:

The same coating liquid as that of the heat sensitive ink layer was coated on a stainless steel plate having mirror surface, and dried at room temperature for 3 days. Further, the coated layer was dried at 60° C. for 12 hours to form a heat sensitive ink layer of a thickness of approx. 30 μm. The layer (film) was cut in size of 30 mm×60 mm to prepare a sample. The sample was heated at 120° C. for 10 minutes, and rapidly cooled using liquid nitrogen. Then, the sample was fixed on a tensile strength tester (Tensilon), and stretched at rate of 300 m/minute under the conditions of 23° C. and 65%RH to measure the tensile strength at break.

As a result, all the heat sensitive ink layers of the heat sensitive ink sheets (Examples 1 to 4) showed tensile strength at break of 2MPa.

Further, a peeling force of the heat sensitive ink layer was measured as follows:

A SBR (styrene butadiene rubber) latex layer of a thickness of 3 μm was formed on a PET (polyethylene terephthalate) film of a thickness of 5 μm by coating, and the ink layer of a thickness of 0.3 μm was formed on the SBR latex layer by coating. A SBR latex layer of a thickness of 0.3 μm was formed on a PET film of a thickness of 100 μm by coating, and the second image receiving layer of a thickness of 2 μm was formed on the SBR latex layer by coating. These films were superposed each other in such a manner that the ink layer was in contact with the second image receiving layer, and cut in size of 35 mm×60 mm to prepare a sample. The sample was pressed with a thermal head in whole area. The resultant was fixed on a tensile strength tester (Tensilon), and stretched at rate of 500 mm/minute under the conditions of 23° C. and 65%RH so that the films was peeled off each other at parallel, to measure the peeling force.

The conditions of pressing the sample with thermal head are as follows:

Thermal head: thin-film thermal head, dot density: 600 dpi, heater size: 70 μm×80 μm, resistivity: 3100 Ω, voltage: 15 V, strobe width: 2.5 msec.

As a result, all the heat sensitive ink layers of the heat sensitive ink sheets (Examples 1 to 4) showed peeling force of 0.40 dyn/mm.

EXAMPLE 5

The procedures of Example 1 were repeated except for changing 0.24 g of the amide compound No. 3 to a nitrogen-containing compounds shown in Table 5 to prepare 5 sets (Samples 1–5) of heat sensitive ink sheets (1 set: cyan ink sheet, magenta ink sheet and yellow ink sheet).

TABLE 5

| Sample No. | Nitrogen-containing Compound No. | Amount |
|---|---|---|
| Samp. 1 | Trioctylamine | 0.15 g |
| Samp. 2 | Tetra-n-butylammonium bromide | 0.15 g |
| Samp. 3 | Triethylmethyl ammonium chloride | 0.15 g |
| Samp. 4 | N-ethylaniline | 0.15 g |
| Samp. 5 | N-methylquinolinium bromide | 0.25 g |

The multicolor image was formed in the same manner as Example 1 on the image receiving sheet prepared in the same manner as Example 1, using each of the obtained 5 sets (Samples 1–5) of heat sensitive ink sheets.

Subsequently, an art paper sheet was placed on the image receiving sheet having the multicolor image at 23° C. and 60%RH, and they were passed through a couple of heat rollers under conditions of 125° C., 4.5 kg/cm and 450 mm/sec. Then, the polyethylene terephthalate film of the image receiving sheet was peeled off from the art paper sheet to form a multicolor image having the second image receiving layer on the art paper sheet. Thus a multicolor image was obtained.

Optical reflection density of a solid portion of each color image was the same as Example 1.

As to the obtained dot of the color image, the qualities such as shape and its variation were evaluated by visual observation of 10 persons. The evaluations were ranked based on evaluation of multicolor image (DD) obtained in Comparison Example 1, as follows:

(Quality of dot)

AA: Sufficiently satisfactory compared with multicolor image of Comparison Example 1

BB: Satisfactory compared with multicolor image of Comparison Example 1

CC: Relatively satisfactory compared with multicolor image of Comparison Example 1

The results are set forth in Table 6

TABLE 6

| Sample No. | Nitrogen-containing Compound No. | Dot Quality: Form | Dot Quality: Variation |
|---|---|---|---|
| Samp. 1 | Trioctylamine | BB | CC |
| Samp. 2 | Tetra-n-butylammonium bromide | AA | AA |
| Samp. 3 | Triethylmethylammonium chloride | BB | BB |
| Samp. 4 | N-ethylaniline | AA | BB |
| Samp. 5 | N-methylquinolinium bromide | AA | BB |

The multicolor image was formed in the same manner as Example 1 on the image receiving sheet prepared in the same manner as Example 1, using each of the obtained 5 sets (Samples 1–5) of heat sensitive ink sheets.

Subsequently, an art paper sheet or matte paper sheet was placed on the image receiving sheet having the multi-color image at 23° C. and 60%RH or at 20° C. and 20%RH, and they were passed through a couple of heat rollers in the same as above. Then, the polyethylene terephthalate film of the image receiving sheet was peeled off to form a multicolor image having the second image receiving layer on an art paper sheet for printing or a matte coated paper sheet for printing. Thus a multicolor image was obtained.

As to the obtained multicolor image, extents of lifting and peeling of the ink layer left on the support of the ink sheet and of the image transferred onto the paper sheet were evaluated by visual observation of 10 persons. The evaluations were ranked based on evaluation of multicolor image (DD) obtained in Comparison Example 1, as follows:

AA: Sufficiently satisfactory compared with multicolor image of Comparison Example 1 (i.e., there is no peeled area)

BB: Satisfactory compared with multicolor image of Comparison Example 1 (i.e., there is little peeled area)

CC: Relatively satisfactory compared with multicolor image of Comparison Example 1 (i.e., there is a little area)

The results are set forth in Table 7

TABLE 7

| | Environment for transferring | | | |
|---|---|---|---|---|
| | 23° C. and 60% RH | | 20° C. and 20% RH | |
| Sample | Matte paper | Art Paper | Matte paper | Art Paper |
| Samp. 1 | BB | BB | BB | BB |
| Samp. 2 | BB | BB | BB | BB |
| Samp. 3 | BB | BB | BB | BB |
| Samp. 4 | BB | BB | BB | BB |
| Samp. 5 | BB | BB | BB | BB |

EXAMPLE 6

Heat sensitive ink sheets and an image receiving sheet were prepared below. Then, a composite of a heat sensitive sheet and an image receiving sheet was irradiated with a laser beam to form a transferred image in the following manner.

(1) Preparation of heat sensitive ink sheet

1) Preparation of coating liquid for light-heat conversion layer

The following components were mixed using a stirrer to prepare a coating liquid for light-heat conversion layer:

| | |
|---|---|
| Cyanine dye abosrbing infrared rays of the following structure: | 0.3 g |
| 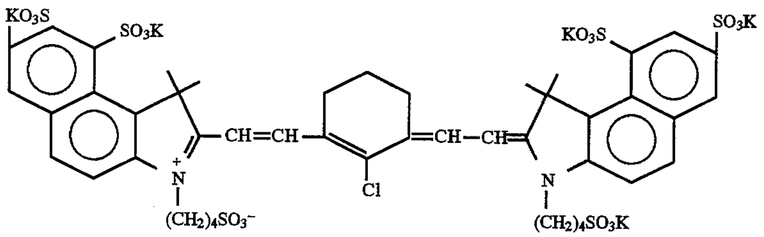 | |
| 5% aqueous solution of polyvinyl alcohol (#205, available from Kuraray Co., Ltd.) | 6 g |
| Isopropyl alcohol | 5 g |
| Ion exchanged water | 20 g |
| Dye abosrbing infrared ray (IR-820, available from Nippon Kayaku Co., Ltd.) | 1.7 g |
| Varnish of polyamic acid (PAA-A, available from Mitsui Toatsu Chemicals, Inc.) | 13 g |
| 1-Methoxy-2-propanol | 60 g |
| Methyl ethyl ketone | 88 g |
| Surface active agent (Megafack F-177, available from Dainippon Ink & Chemicals Inc.) | 0.05 g |

2) Formation of light-heat conversion layer

A first subbing layer comprising styrene/butadiene copolymer (thickness: 0.5 μm) and a second subbing layer comprising gelatin (thickness: 0.1 μm) were formed on a polyethylene terephthalate film (thickness: 75 μm) in order. Then, the above coating liquid for light-heat conversion layer was coated on the second subbing layer using a whirler, and dried for 2 minutes in an oven of 100° C. to form a light-heat conversion layer (thickness: 0.2 μm measured by feeler-type thickness meter), absorbance of light of 830 nm: 1.4).

3) Preparation of coating liquid for heat sensitive peeling layer

The following components were mixed using a stirrer to prepare a coating liquid for heat sensitive peeling layer:

| | |
|---|---|
| Nitrocellulose (HIG120, available from Asahi Chemical Co., Ltd.) | 1.3 g |
| Methyl ethyl ketone | 26 g |
| Propylene glycol monomethylether acetate | 40 g |
| Toluene | 92 g |
| Surface active agent (Megafack F-177, available from Dainippon Ink & Chemicals Inc.) | 0.01 g |

4) Formation of heat sensitive peeling layer

The above coating liquid for heat sensitive peeling layer was coated on the light-heat conversion layer using a whirler, and dried for 2 minutes in an oven of 100° C. to form a heat sensitive peeling layer (thickness: 0.1 μm (measured by feeler-type thickness meter a layer formed by coating the liquid on a surface of a hard sheet in the same manner as above)).

5) Preparation of coating liquid for heat sensitive ink layer (image forming layer) of magenta The following components were mixed using a stirrer to prepare a coating liquid for heat sensitive ink layer for magenta image:

| Preparation of mother liquor | |
|---|---|
| Polyvinyl butyral (Denka Butyral #2000-L available from Denki Kagaku Kogyo K.K.) | 12.6 g |
| Magenta pigments (C.I. P.R. 57:1) | 18 g |
| Dispersing agent (Solspers S-20000, available from ICI Japan Co., Ltd.) | 0.8 g |
| n-Propyl alcohol | 110 g |
| Glass beads | 100 g |

The above materials were placed in a paint shaker (available from Toyo Seiki Co., Ltd.) and were subjected to dispersing treatment for two hours to prepare the mother liquor. The obtained mother liquor was diluted with n-propyl alcohol, and particle size distribution of the pigments in the diluted liquid was measured by a particle size measuring apparatus (utilizing laser beam scattering system). The measurement showed that the pigments of not less than 70 weight % had particle size of 180 to 300 nm.

| Preparation of coating liquid | |
|---|---|
| Mother liquor prepared above | 6 g |
| n-Propyl alcohol | 60 g |
| Nitrogen-containing compound (Compound No. 3 of the formula (I)) | 0.15 g |
| Surface active agent (Megafack F-177, available from Dainippon Ink & Chemicals Inc.) | 0.01 g |

The above components were mixed with a stirrer to prepare a coating liquid for forming a heat sensitive ink layer of magenta.

6) Formation of heat sensitive ink layer of magenta

The above coating liquid for heat sensitive ink layer of magenta image was coated on the heat sensitive peeling layer using a whirler, and dried for 2 minutes in an oven of 100° C. to form a heat sensitive ink layer (thickness: 0.3 μm (measured by feeler-type thickness meter a layer formed by coating the liquid on a surface of a hard sheet in the same manner as above). The obtained ink layer showed optical transmission density of 0.7 (measured by Macbeth densitometer using green filter)

Thus, a heat sensitive ink sheet (magenta image) composed of a support, a light-heat conversion layer, a heat sensitive peeling layer and heat sensitive ink layer of magenta image wherein a number of crystals of stearic acid amide were dispersed on the layer, was prepared.

(2) Preparation of image receiving sheet

The following coating liquids for first and second image receiving layers were prepared:

| | |
|---|---|
| (Coating liquid for first image receiving layer) | |
| Vinyl chloride copolymer (Zeon 25, available from Nippon Geon Co., Ltd.) | 9 g |
| Surface active agent (Megafack F-177, available from Dainippon Ink & Chemicals Inc.) | 0.1 g |
| Methyl ethyl ketone | 130 g |
| Toluene | 35 g |
| Cyclohexanone | 20 g |
| Dimethylformamide | 20 g |
| (Coating liquid for second image receiving layer) | |
| Methyl methacrylate/ethyl acrylate/ metacrylic acid copolymer (Diyanal BR-77, available from Mitsubishi Rayon Co., Ltd.) | 17 g |
| Alkyl acrylate/alkyl methacrylate copolymer (Diyanal BR-64, available from Mitsubishi Rayon Co., Ltd.) | 17 g |
| Pentaerythritol tetraacrylate (A-TMMT, available from Shin Nakamura Kagaku Co., Ltd.) | 22 g |
| Surface active agent (Megafack F-177P, available from Dainippon Ink & Chemicals Inc.) | 0.4 g |
| Methyl ethyl ketone | 100 g |
| Hydroquinone monomethyl ether | 0.05 g |
| Photopolymerization initiator (2,2-dimethoxy-2-phenylacetophenone) | 1.5 g |

The above coating liquid for first image receiving layer was coated on a polyethylene terephthalate film (thickness: 75 μm) using a whirler, and dried for 2 minutes in an oven of 100° C. to form a first image receiving layer (thickness: 26 μm) on the film.

Subsequently, the above coating liquid for second image receiving layer was coated on the first image receiving layer using a whirler, and dried for 2 minutes in an oven of 100° C. to form a second image receiving layer (thickness: 1 μm).

(3) Preparation of composite for forming image

The above heat sensitive ink sheet and the above image receiving sheet were allowed to stand at room temperature for one day, and they were placed at room temperature in such a manner that the heat sensitive ink and the second image receiving layer came into contact with each other and passed through a couple of heat rollers under conditions of 70° C., 4.5 kg/cm and 2 m/minute to form a composite. Temperatures of the sheets when passed through the rollers were measured by a thermocouple. The temperatures each were 50° C.

(4) Fixation of composite on image forming device

The above composite was cooled at room temperature for 10 minutes. Then, the composite was wound around a rotating drum provided with a number of suction holes in such a manner that the image receiving sheet was in contact with a surface of the rotating drum, and the composite was fixed on the rotating drum by sucking inside of the drum.

(5) Image recording

The laser beam (λ:830 nm, out-put power:110 mW) was focused at a beam diameter of 7 μm on the surface of the light-heat conversion layer of the composite to record a image (line), while, by rotating the drum, the laser beam was moved in the direction (sub-scanning direction) perpendicular to the rotating direction (main-scanning direction).

Main-scanning rate: 10 m/sec.

Sub-scanning pitch (Sub-scanning amount per one time): 5 μm (6) Formation of transferred image The recorded composite was removed from the drum, and the heat sensitive ink sheet was peeled off from the image receiving sheet to obtain the image receiving sheet having the transferred image (lines) of the heat sensitive ink material wherein lines of magenta having width of 5.0 μm were formed in only the irradiation portion of the laser beam.

(7) Formation of retransferred image

The obtained image receiving sheet having the transferred magenta image (lines) was superposed on an art paper sheet to form a retransferred magenta image on the art paper sheet in the same manner as Example 1.

Also as for each of Samples 7 to 14 and Comparison Sample 1, the above procedures of Sample 1 were repeated except for changing the nitrogen-containing compound into the compound set forth in Table 8 to form an image receiving sheet having transferred magenta image (lines).

(8) Evaluation

Optical reflection density of a solid portion of each color image was the same as Example 1.

As for the color images, the evaluations of gradation reproduction, shape of dot and approximation to print were ranked based on evaluation of color image (DD) obtained in Comparison Sample 1, as follows:

(Shape of dot)

AA: Sufficiently satisfactory compared with multicolor image of Comparison Sample 1

BB: Satisfactory compared with multicolor image of Comparison Sample 1

(Gradation reproduction)

AA: Excellent compared with multicolor image of Comparison Sample 1

BB: Good compared with multicolor image of Comparison Sample 1

(Approximation to print)

AA: Very high compared with multicolor image of Comparison Sample 1

BB: High compared with multicolor image of Comparison Sample 1

The results of the evaluations are set forth in Table 8.

TABLE 8

| Nitrogen-containing Compound No. | | Shape of Dot | Reproductivity of Gradation | Approximation to Print |
|---|---|---|---|---|
| Samp. 6 | No. 3 | BB | BB | BB |
| Samp. 7 | No. 7 | BB | BB | BB |
| Samp. 8 | No. 9 | AA | AA | BB |
| Samp. 9 | No. 10 | BB | BB | BB |
| Samp. 10 | Trioctylamine | BB | BB | BB |
| Samp. 11 | Tetra-n-butyl ammonium bromide | BB | BB | BB |
| Samp. 12 | Triethyl-methylammonium chloride | BB | BB | BB |
| Samp. 13 | N-ethylaniline | BB | BB | BB |
| Samp. 14 | M-methyl-quinolinium bromide | BB | BB | BB |
| Com. Samp | — | DD | DD | DD |

Note:
The compound No. is the number of examples of the formula (I).

We claim:

1. A heat sensitive ink sheet having a support sheet and a heat sensitive ink layer having a thickness of 0.2 to 0.6 μm which is formed of a heat sensitive ink material comprising 30 to 70 weight % of colored pigment, 25 to 65 weight % of amorphous organic polymer having a softening point of 40° to 150° C., and 0.1 to 20 weight % of a nitrogen-containing compound which comprises at least one compound selected from the group consisting of an amide compound having the formula (I):

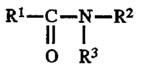
(I)

in which $R^1$ represents an alkyl group of 8 to 24 carbon atoms, an alkoxyalkyl group of 8 to 24 carbon atoms, an alkyl group of 8 to 24 carbon atoms having a hydroxyl group, or an alkoxyalkyl group of 8 to 24 carbon atoms having a hydroxyl group, and each of $R^2$ and $R^3$ independently represents a hydrogen atom, an alkyl group of 1 to 12 carbon atoms, an alkoxyalkyl group of 1 to 12 carbon atoms, an alkyl group of 1 to 12 carbon atoms having a hydroxyl group, or an alkoxyalkyl group of 1 to 12 carbon atoms having a hydroxyl group, provided that $R^1$ is not the alkyl group in the case that $R^2$ and $R^3$ both represent a hydrogen atom;

a quaternary ammonium salt having the formula (II):

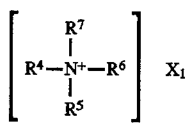
(II)

in which $R^4$ represents an alkyl group having 1 to 18 carbon atoms or an aryl group of 6 to 18 carbon atoms, each of $R^5$, $R^6$ and $R^7$ independently represents a hydrogen atom, a hydroxyl group, an alkyl group of 1 to 18 carbon atoms, or an aryl group of 6 to 18 carbon atoms, and $X_1$ represents a monovalent anion; and a quaternary ammonium salt having the formula (III):

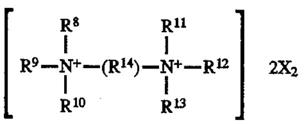
(III)

in which each of $R^8$, $R^9$, $R^{10}$, $R^{11}$, $R^{12}$ and $R^{13}$ independently represents a hydrogen atom, a hydroxyl group, an alkyl group of 1 to 18 carbon atoms or an aryl group of 6 to 18 carbon atoms, $R^{14}$ represents an alkylene group of 1 to 12 carbon atoms, and $X_2$ represents a monovalent anion.

2. The heat sensitive ink sheet as defined in claim 1, wherein at least 70 weight % of the colored pigment has a particle size of 0.1 to 1.0 μm.

3. The heat sensitive ink sheet as defined in claim 1, which further comprises a dye in said heat sensitive ink layer.

4. The heat sensitive ink sheet as defined in claim 1, wherein said amorphous organic polymer is selected from the group consisting of butyral resin and styrene-maleic acid half ester resin.

5. The heat sensitive ink sheet as defined in claim 1, wherein said nitrogen-containing compound is an amide compound of formula (I).

6. The heat sensitive ink sheet as defined in claim 1, wherein the heat sensitive ink layer has a tensile strength at break of not more than 10 MPa.

7. An image forming method which comprises the steps of:

superposing the heat sensitive ink sheet of claim 1 on an image receiving sheet;

placing imagewise a thermal head on the support of the heat sensitive ink sheet to form an image of the ink material with area gradation on the image receiving sheet;

separating the support of the heat sensitive ink sheet from the image receiving sheet so that the image of the ink material can be retained on the image receiving sheet;

superposing the image receiving sheet on a white paper sheet in such a manner that the image of the ink material is in contact with a surface of the white paper sheet; and separating the image receiving sheet from the white paper sheet, keeping the image of the ink material on the white paper sheet, said image of the ink material on the white paper sheet having an optical reflection density of at least 1.0.

8. An image forming method which comprises the steps of:

superposing the heat sensitive ink sheet of claim 1 on an image receiving sheet;

irradiating a laser beam modulated by digital signals on the heat sensitive ink layer through the support of the heat sensitive ink sheet to form an image of the ink material on the image receiving sheet;

separating the support of the heat sensitive ink sheet from the image receiving sheet so that the image of the ink material can be retained on the image receiving sheet;

superposing the image receiving sheet on a white paper sheet in such a manner that the image of the ink material is in contact with a surface of the white paper sheet; and separating the image receiving sheet from the white paper sheet, keeping the image of the ink material on the white paper sheet, said image of the ink material on the white paper sheet having an optical reflection density of at least 1.0.

9. The image forming method as defined in claim 8, wherein the formation of the image of the ink material on the image receiving sheet is done through ablation of the image from the support of the heat sensitive ink sheet.

10. The heat sensitive ink sheet as defined in claim 1, wherein said support is a polyester film having a thickness of about 5 μm.

11. The heat sensitive ink sheet as defined in claim 1, wherein said colored pigment is selected from the group consisting of carbon black, azo pigments, phthalocyanine pigments, qunacridone pigments, thioindigo pigments, anthraquinone pigments, isoindolin pigments, and combinations thereof.

* * * * *